United States Patent
Kitamura

(10) Patent No.: US 7,546,569 B2
(45) Date of Patent: Jun. 9, 2009

(54) AUTOMATIC TRACE DETERMINATION METHOD

(75) Inventor: Tamotsu Kitamura, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 284 days.

(21) Appl. No.: 11/520,266

(22) Filed: Sep. 12, 2006

(65) Prior Publication Data
US 2007/0064534 A1    Mar. 22, 2007

(30) Foreign Application Priority Data
Sep. 12, 2005   (JP)   ............... 2005-264387

(51) Int. Cl.
*G06F 17/50*   (2006.01)
(52) U.S. Cl. ............... 716/12; 716/13; 716/14
(58) Field of Classification Search ...... 716/2, 716/11–14
See application file for complete search history.

(56) References Cited

U.S. PATENT DOCUMENTS

| | | | |
|---|---|---|---|
| 5,644,500 | A | 7/1997 | Miura et al. |
| 5,673,201 | A | 9/1997 | Malm et al. |
| 6,330,707 | B1 | 12/2001 | Shinomiya et al. |
| 6,609,237 | B1 | 8/2003 | Hamawaki et al. |
| 7,114,141 | B1 * | 9/2006 | Teig et al. ............ 716/12 |
| 7,117,468 | B1 * | 10/2006 | Teig et al. ............ 716/11 |
| 7,246,338 | B1 * | 7/2007 | Teig et al. ............ 716/12 |
| 2002/0035720 | A1 | 3/2002 | Kitamura et al. |

FOREIGN PATENT DOCUMENTS

| | | |
|---|---|---|
| EP | 0424908 | 5/1991 |
| JP | 10055382 | 2/1998 |
| JP | 10198722 | 7/1998 |
| JP | 10-209288 | 8/1998 |
| JP | 11-161694 | 6/1999 |
| JP | 2001-44288 | 2/2001 |
| JP | 2001-350813 | 12/2001 |

OTHER PUBLICATIONS

European Search Report.
"Surf: A Rubber-Band Routing System for Multichip Modules", D. Staepelaere et al., IEEE Design & Test of Computers, 10 (Dec. 1993), No. 4, pp. 18-26.

(Continued)

*Primary Examiner*—Vuthe Siek
(74) *Attorney, Agent, or Firm*—Walter G. Hanchuk; Chadbourne & Parke LLP

(57) ABSTRACT

An automatic trace determination process comprises the steps of: determining whether an inspection line connecting between two points that are to be a starting point and an end point intersects with other traces or not; when the inspection line intersects with other traces, determining a straight line section connecting between the starting point and either one of terminal points of one of such other traces that exists in the nearest position to the starting point as a segment that constitutes a candidate of the optimal route; and resetting the terminal point used for determining the candidate of the optimal route when said inspection line intersects with the other traces as a new starting point, wherein, based on inspection lines that are newly drawn between the end point and such new starting points, the processes in these steps are further performed to generate the candidate constituted by the segments.

19 Claims, 21 Drawing Sheets

OTHER PUBLICATIONS

."Layer Assignment for Rubber Band Routing", Tal Dayan et al., UCSC-CRL-94-04, Jan. 20, 1993, pp. 1-18 (XP-002386401).
"Rubber-Band Based Topological Router", Tal Dayan, USCS—Jun. 1997, pp. 89-129 (XP-002386416).
"Geometric Shortest Paths and Network Optimization", J. S. B. Mitchell, Aug. 12, 1998, pp. 1-62 (XP-002389214).
"Exercies" E. Horowitz et al., Computer Algorithms, Computer Science Press, New York, 1998, pp. 241-275 (XP-002392397).

* cited by examiner

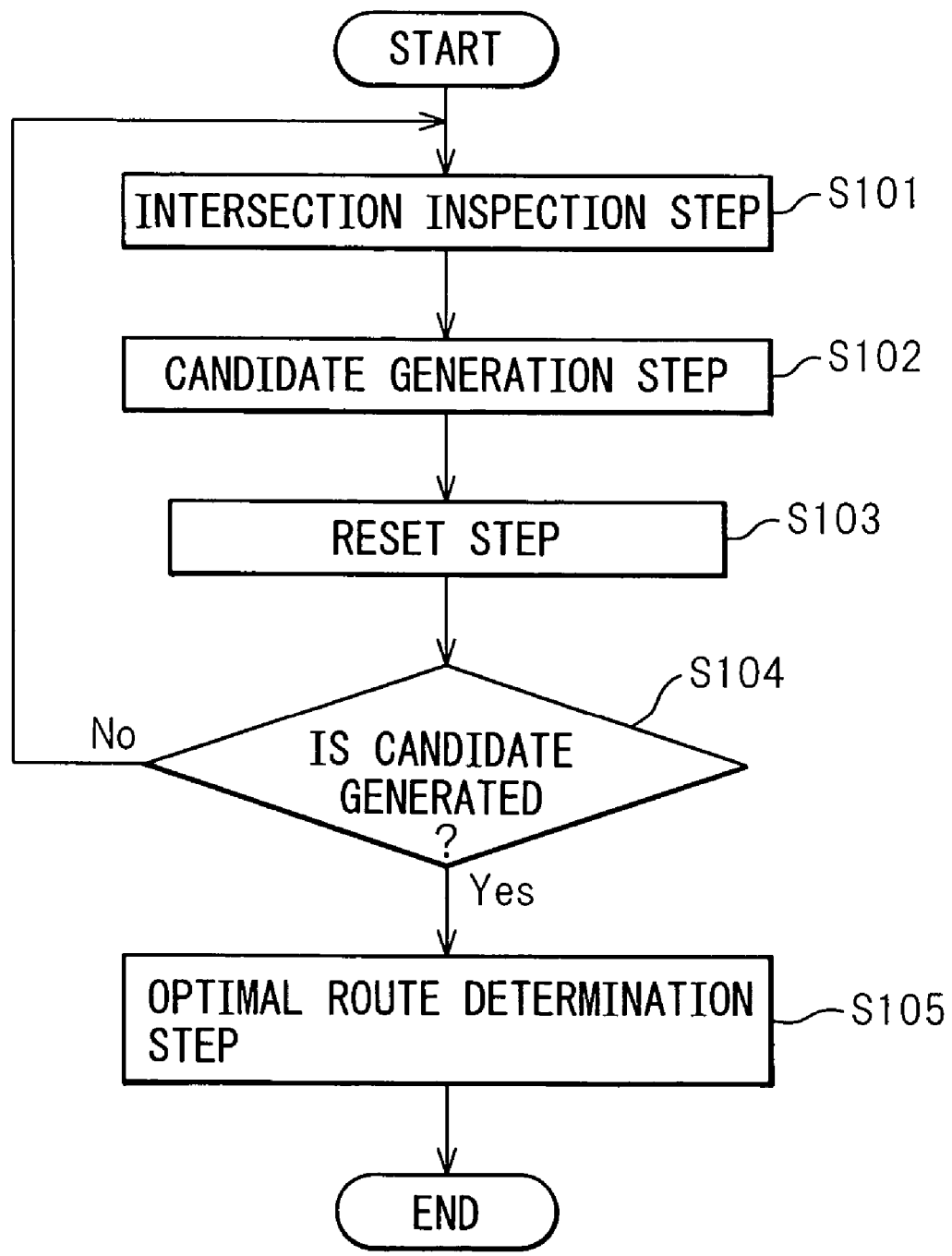

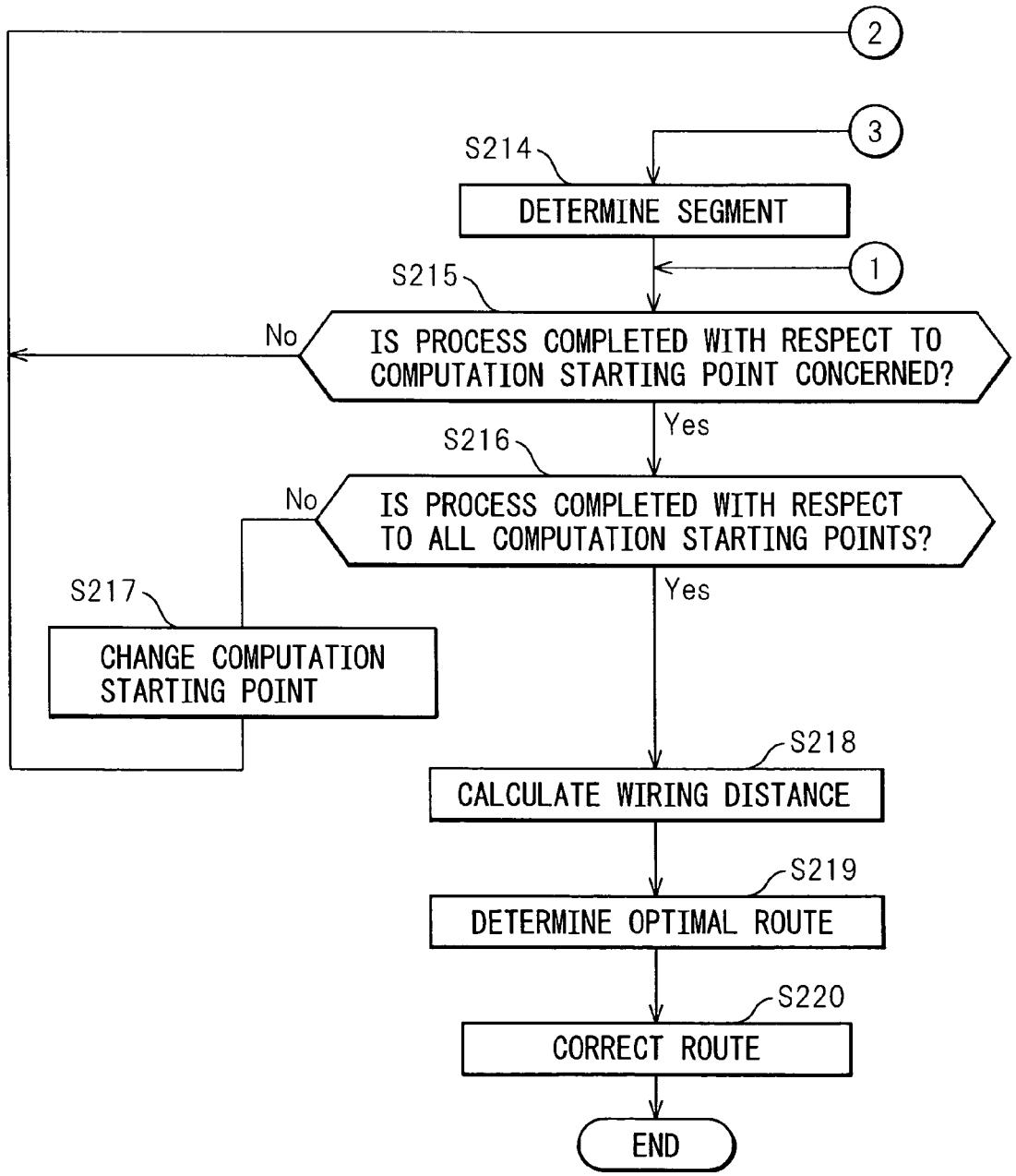

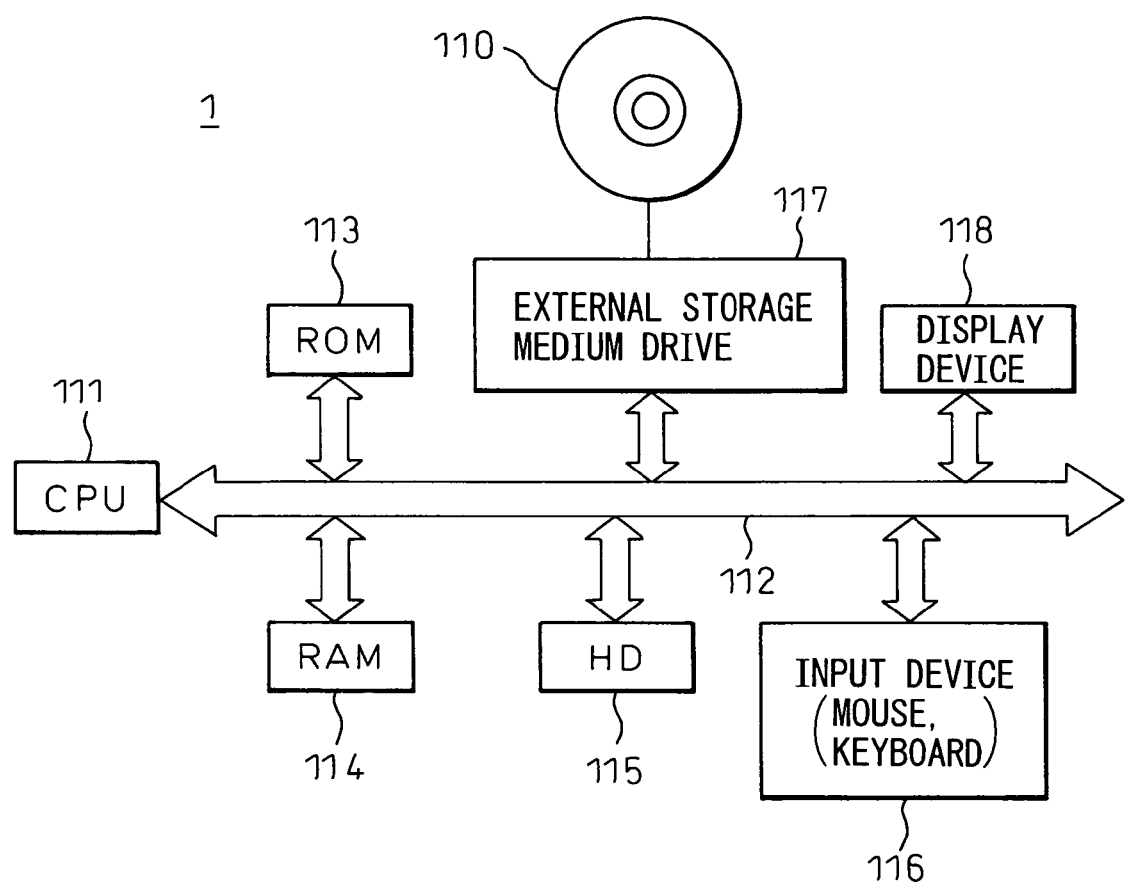

AUTOMATIC TRACE DETERMINATION METHOD

BACKGROUND OF THE INVENTION

1. Field of the Invention

The present invention relates to an automatic trace determination method for determining a trace route on a substrate, that does not intersect with other traces on the substrate, automatically and by computer computation.

2. Description of the Related Art

For example, in semiconductor integrated circuits such as an LSI, on a PCB and the like, as a typical example of an automatic wiring method for automatically providing traces without intersecting with obstacles existing on a substrate, a method called a labyrinth search method is described, for example, in Japanese Unexamined Patent Publication No. 11-161694, Japanese Unexamined Patent Publication No. 2001-350813, Japanese Unexamined Patent Publication No. 2001-044288, and Japanese Unexamined Patent Publication No. 10-209288.

In the labyrinth search method, trace routes on a substrate are set so as to secure clearance from obstacles and so as not to intersect with the obstacles by bypassing such obstacles by changing direction by 90 degrees or, in some cases, by 45 degrees. Such a setting technique can be implemented, in particular, in an LSI, a PCB and the like, which have peculiar pattern characteristics in that the disposed positions and shapes of the obstacles in the LSI, the PCB and the like have a certain regularity.

On substrates of semiconductor packages such as PBGA, EBGA and the like, there exist a large number of elements, such as planes, gates, marks, internal components or other traces in the packages, that may obstruct the traces and shapes and the disposed positions or angles of such obstacles may vary significantly. Further, vias, balls, bonding pads (B/P), flip chip pads (F/C) or the like, which are to be starting or end points of the traces, may be positioned variously. Therefore, in trace design for the semiconductor packages, when the obstacles on the substrate are bypassed, the trace routes have to bypass the obstacles by changing direction by arbitrary angles which are not limited to 90 or 45 degrees. Thus, the labyrinth search method that has been conventionally used for automatic wiring in an LSI, a PCB and the like cannot be applied to the semiconductor packages.

In view of these circumstances, in trace design for the semiconductor packages, a designer typically designs the trace routes of the semiconductor packages on a virtual plane by trial and error depending on the designer's skill, experience and intuition and, for example, by using a CAD system. In such manual trace design by trial and error, as the required traces become more complicated, the effort, time and difficulty for achieving the optimal traces is increased. Further, an unevenness in the quality of finished products is also increased. In reality, because the manual trace design by trial and error requires some days and it is not economical to spend more time on trace designing, the designer has to compromise to provide a certain design quality. As the semiconductor packages are miniaturized and integrated, automatization of trace design of the semiconductor packages will be one of the most important tasks in the future.

In particular, when a trace, the optimal route of which is to be determined, is obstructed by other traces, it is difficult to automate the trace design. For example, in order to secure clearance from other obstructing traces so as to implement an optimal trace route, a position of the trace to be processed may be maintained but positions of the other traces may be moved. In such case, trace positions may be changed significantly over an entire substrate.

Further, in the related-art automatic wiring method, it is possible to determine optimal routes of all traces on a substrate at a time but it is difficult to change wiring conditions such as, for example, trace widths, clearance and the like, of some of the traces.

In view of the above problems, it is an object of the present invention to provide an automatic trace determination method that can determine a trace route, on a substrate, that does not intersect with other traces on the substrate, automatically and in a short time.

SUMMARY OF THE INVENTION

In order to achieve the above object, according to the present invention, two points that are to be a starting point and an end point of a trace are connected by an inspection line and, when this inspection line intersects with other traces, a straight line section connecting between the above-mentioned starting point and either one of terminal points of one of the other traces that exists in the nearest position to the starting point is determined as a segment that constitutes a candidate of an optimal route. Then, at this time, the terminal point used for determining the above-mentioned candidate is reset as a new starting point. Further, based on an inspection line connecting between such new starting point and the end point, the above-mentioned processes are performed repeatedly to generate a candidate route constituted by segments. Eventually, an optimal route is determined from the candidate route thus generated.

FIG. 1 is a flow chart of an automatic trace determination method according to the present invention. The automatic trace determination method according to the present invention, that determines an optimal trace route on a substrate that does not intersect with other traces on such substrate automatically and by computation, is performed as follows.

First, in an intersection inspection step S101, it is determined whether an inspection line connecting two points that are to be a starting point and an end point of a trace intersects with other traces or not.

When the inspection line intersects with the other traces, in a candidate generation step S102, a straight line section connecting between the starting point and either one of terminal points of one of such other traces that exists in the nearest position to the starting point is determined as a segment that constitutes a candidate for an optimal route.

Next, in a reset step S103, the terminal point used for determining the candidate in the candidate generation step S102 when the inspection line intersects with the other traces is reset as a new starting point.

Here, when an inspection line that is newly drawn between the above-mentioned end point and the terminal point that has been reset as the new starting point in the reset step S103 intersects again with the other traces, the intersection with which has already been determined in the intersection inspection step S101, the candidate generation step S102 redetermines a straight line section connecting between another terminal point of the trace having such new starting point and the above-mentioned starting point as the segment and, then, the reset step S103 resets the another terminal point, of the trace having such starting point, as a new starting point.

Then, based on inspection lines that are newly drawn between the above-mentioned end point and such new starting points that are reset in the reset step S103, the processes in the intersection inspection step S101, the candidate generation step S102 and the reset step S103 are performed repeatedly to generate the candidate constituted by the above-mentioned segments. Thus, the candidate optimal route is constituted by combining a plurality of segments together and, therefore, the processes in the intersection inspection step S101, the candidate generation step S102 and the reset step S103 are repeated through a step S104 till all the segments constituting the candidates are determined.

In an optimal route determination step S105, an optimal route is determined from the candidates thus generated.

In this connection, the above-mentioned processes S101-S105 in the automatic trace determination process can be implemented in the form of a software program that can be operated by an arithmetic processing unit such as a computer. An apparatus for performing the above-mentioned processes and a program for allowing the computer to perform the above-mentioned processes could be easily implemented by those, skilled in the art, who understand the following description. Further, it would be evident to those skilled in the art that the program for allowing the computer to perform the above-mentioned processes may be stored in storage media.

BRIEF DESCRIPTION OF THE DRAWINGS

The present invention will be more clearly understood from the description as set below with reference to the accompanying drawings, wherein:

FIG. 1 is a flow chart of an automatic trace determination method according to the present invention;

FIGS. 2A and 2B are flow charts of an automatic trace determination method according to an embodiment of the present invention;

FIG. 20 is a block diagram showing a configuration of an automatic trace determination apparatus of an embodiment of the present invention that operates according to a program that is stored on a storage medium.

DESCRIPTION OF THE PREFERRED EMBODIMENTS

Figure 2A:
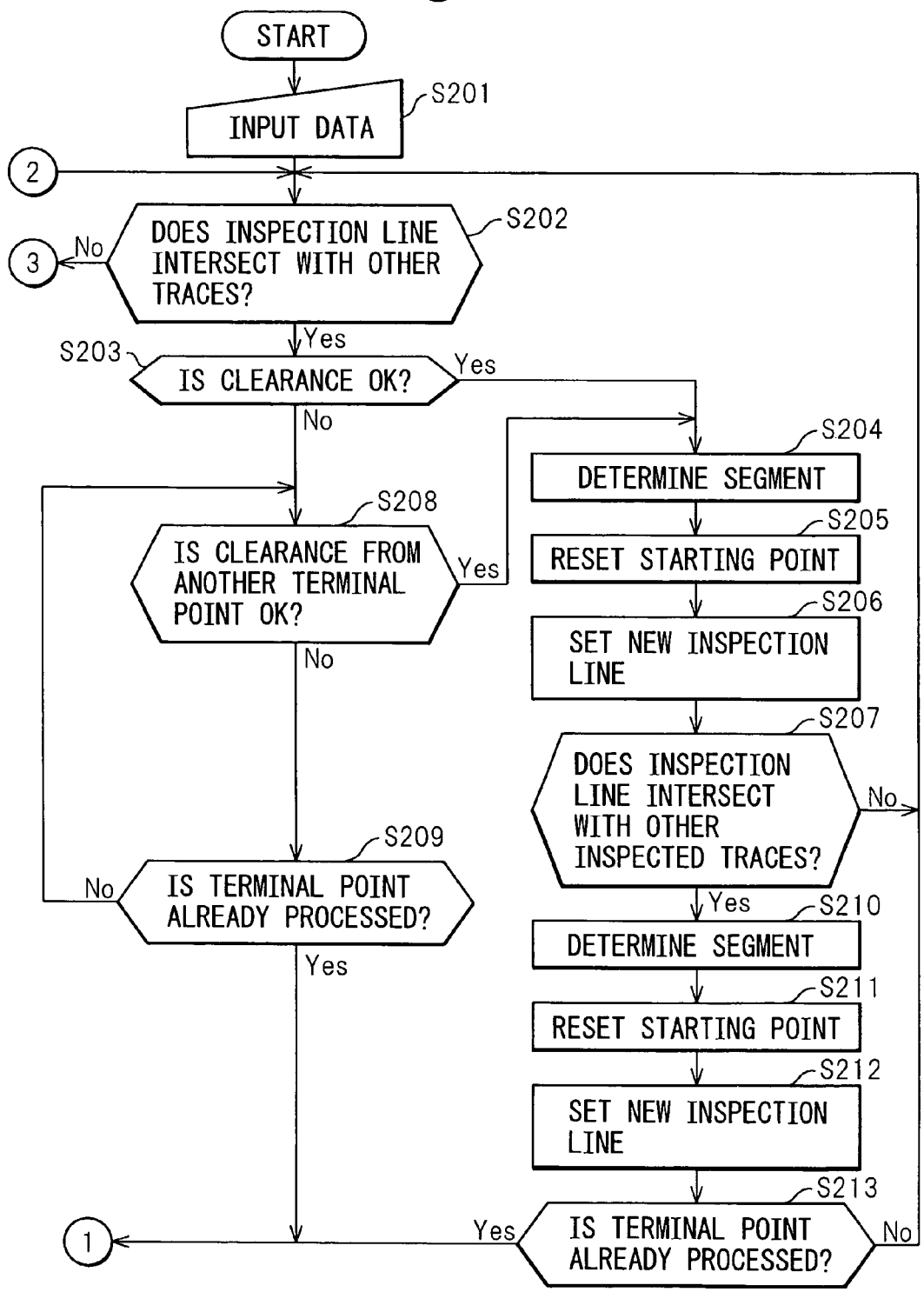

FIGS. 2A and 2B are flow charts of an automatic trace determination method according to an embodiment of the present invention. Processes S202-S220 in the automatic trace determination according to the embodiment of the present invention are performed by an arithmetic processing unit such as a computer.

In step S201, before starting the automatic trace determination process, coordinate information about a starting point and an end point of a trace, the optimal route of which is to be determined, information about vias, balls and bonding pads (B/P) that are to be starting points or end points of traces, information about planes, gates, marks, internal components and the like (for example, information about their shapes, disposed positions or angles), and various data about rules for clearance is input to the computer.

In step S202, it is determined whether an inspection line connecting between two points that are to be the starting point and the end point of the trace intersects with other traces or not. If it is decided that the inspection line intersects with the other traces in step S202, the process proceeds to step S203. If it is decided that the inspection line does not intersect with the other traces in step S202, the process proceeds to step S214.

In step S203, among the other traces intersecting with the inspection line, clearance between a terminal point of one of the other traces that exists in the nearest point to the starting point and the traces that exist around such terminal point is determined. More specifically, it is determined whether clearance from one of terminal points of such other trace that is nearer to said starting point can be secured or not. If such clearance can be secured, the process proceeds to step S204 and, on the other hand, if such clearance cannot be secured, the process proceeds to step S208.

If the clearance from one of the terminal points of such other trace that is nearer to the starting point can be secured, in step S204, a straight line section connecting between the starting point and the terminal point nearer to the starting point is determined as a segment. This segment constitutes a candidate optimal route and, as described in detail below, the candidate optimal route is generated by combining a plurality of segments together. Next, in step S205, such a terminal point nearer to the starting point is reset as a new starting point. Then, in step S206, a new inspection line is set between the end point and such new starting point. Here, the step 204 and the steps 205 and 206 may be performed in reverse order or these processes may be performed simultaneously.

On the other hand, if the clearance from one of the terminal points of such other trace that is nearer to the starting point cannot be secured, in step S208, also with respect to terminal points other than the terminal point that cannot secure the clearance, clearance from the traces that exist around this terminal point is further determined. More specifically, through a process of step S209, among the terminal points of the trace resulting in the clearance obstruction, with respect to the terminal point that does not cause the clearance obstruction and with respect to the terminal point farther from the starting point, clearance from the traces that exist around such terminal point is further determined. The process of step S209 is performed for preventing the already determined route from being uselessly determined again and for preventing the processes from falling into an infinite loop.

In step S208, if it is decided that the clearance can be secured with respect to any of the terminal points subject to the further clearance inspection, the process proceeds to step S204. In step S204, a straight line section connecting between the starting point and the terminal point that is nearest to the starting point among the terminal points that can secure the clearance is determined as a segment. Next, in step S205, such terminal point that is nearest to the starting point is reset as a new starting point. Then, in step S206, a new inspection line is set between the end point and such a new starting point.

In step S207, it is determined whether the new inspection line that has been reset in step S206 intersects with the other traces, the intersection with which has already been determined, again or not. If such new inspection line does not intersect with the other traces, the intersection with which has already been determined, the process returns to step S202 and, on the other hand, if such a new inspection line intersects with the other traces, the intersection with which has already been determined, the process proceeds to step S210.

In step S210, a straight line section connecting between the starting point and another terminal point of the trace having such new starting point (that is to say, the new starting point that has been set in step S205) is determined as a segment. Next, in step S211, the other terminal point of the trace having such new starting point is reset as a new starting point (that is to say, a further new starting point that is different from the new starting point set in step S205). Then, in step S212, a new inspection line is set between the end point and such new starting point (that is to say, the new starting point that has been set in step S211).

On the other hand, in step S202, if it is decided that the inspection line does not intersect with the other traces, the process proceeds to step S214.

In step S214, such an inspection line is determined as a candidate optimal route or a segment constituting such a candidate.

In this embodiment, the above-mentioned processes are performed also with respect to a case in which the starting point to start the computation and the end point that have been set initially are reversed and the computation starting point is reset and with respect to a case in which, among the terminal points of the other traces intersecting with the inspection line connecting between the two points that are to be the starting point and the end point of the trace, the optimal route of which is to be determined, the terminal point nearer to the starting point or the end point of the trace is reset as the computation starting point and the candidate optimal routes are generated also with respect to these cases. In particular, in the latter case, the processes are performed from the set computation starting point in both directions toward the starting point and the end point of the trace to generate the candidates.

Thus, in step S215, it is determined whether the process for generating the candidate optimal route is completed with respect to the set computation starting point or not. If it is not completed, the process returns to step S202 and, on the other hand, if it is completed, the process proceeds to step S216.

Further, in step S216, it is determined whether the process for generating the candidate optimal routes is completed with respect to all the computation starting points or not. If it is not completed, the process returns to step S217 and, on the other hand, if it is completed, the process proceeds to step S218. In step S217, the computation starting point is changed.

In step S218, the distances along the generated optimal routes are calculated. Then, in step S219, among the plurality of generated candidates, a candidate having the shortest distance from the starting point to the end point is eventually determined as an optimal route.

The optimal route generated as described above is configured to pass through the terminal points of the other traces and, therefore, in step S220, such optimal route is corrected to secure clearance between the optimal route determined in step S219 and the other traces. As a variation of this, before performing the step S202, the clearance to be secured may be taken into account in advance and, then, the above-mentioned processes may be performed. In this case, the processes may be performed by enlarging the trace, the optimal route of which is to be determined, and the other traces for the required clearance and, then, replacing the data about the traces for the processes described above with the data taking the clearance into account in advance.

As a variation on the embodiment described above, the automatic trace determination process may be performed only with respect to the starting point to start the computation and the end points that have been set initially and the generated one candidate may be determined as an optimal route and, in this case, the processes of steps S215-S218 are unnecessary.

Hereinafter, an automatic wiring process will be described with reference to several specific examples.

FIGS. 3-13 are diagrams for describing a first specific example of generation of an optimal trace route by an automatic trace determination process in an embodiment of the present invention. In the figures, inspection lines are indicated by alternate long and short dashed lines and determined segments are indicated by thin solid lines.

Figure 3:
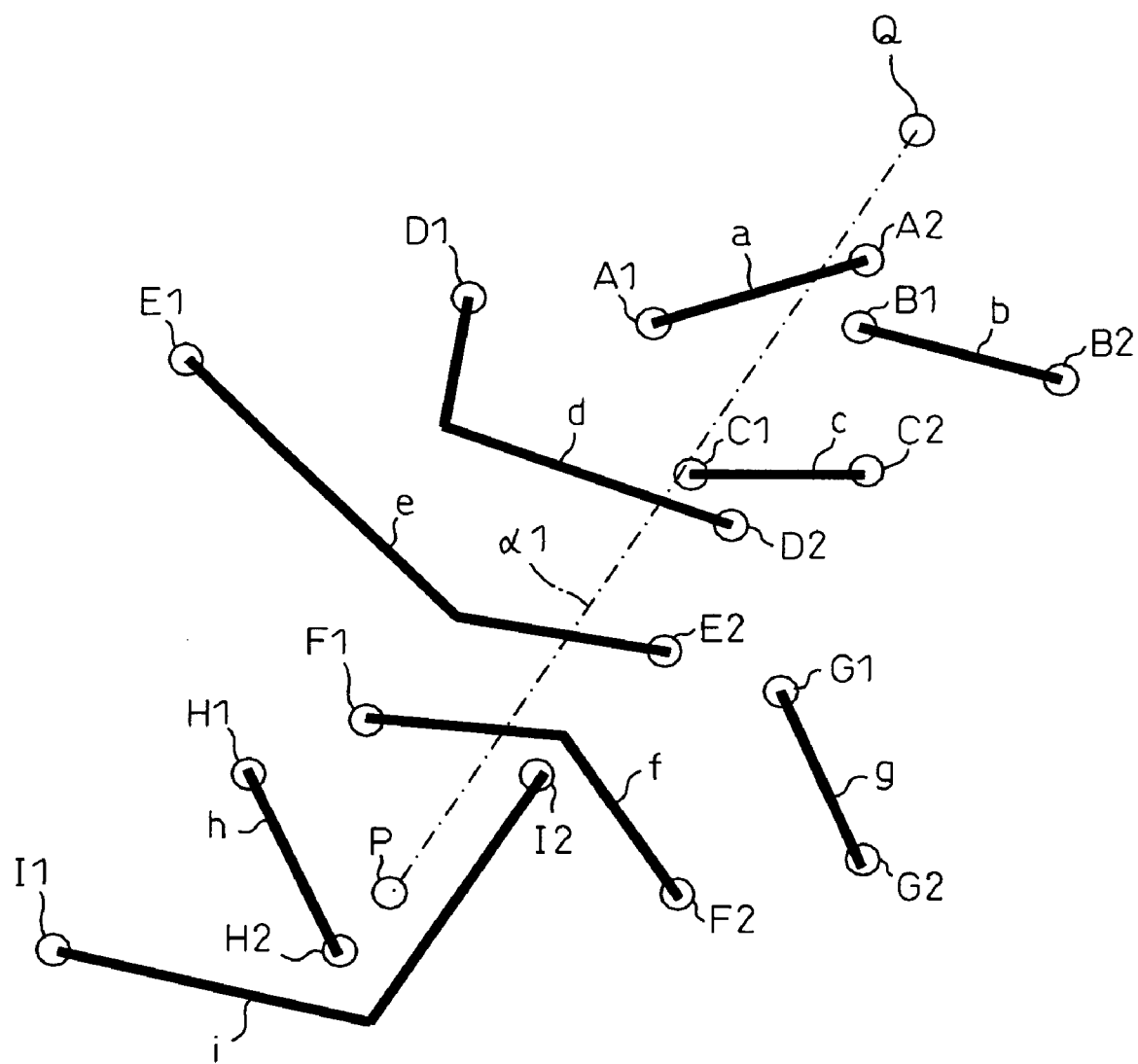
FIGS. 3-13 are diagrams for describing a first specific example of generation of an optimal trace route by an automatic trace determination process in an embodiment of the present invention.

In the first specific example, as shown in FIG. 3, it is assumed that, between a point P, which is to be a starting point of a trace, the optimal route of which is to be determined on a substrate, and a point Q, which is to be an end point, a plurality of other traces a, b, c, d, e, f, g, h and i (indicated by thick solid lines in the figures) that are different from the above-mentioned trace exist. Here, terminal points of the traces a, b, c, d, e, f, g, h and i are designated as A1 and A2, B1 and B2, C1 and C2, D1 and D2, E1 and E2, F1 and F2, G1 and G2, H1 and H2, and 11 and 12, respectively (indicated by circles in the figures).

Figure 4:
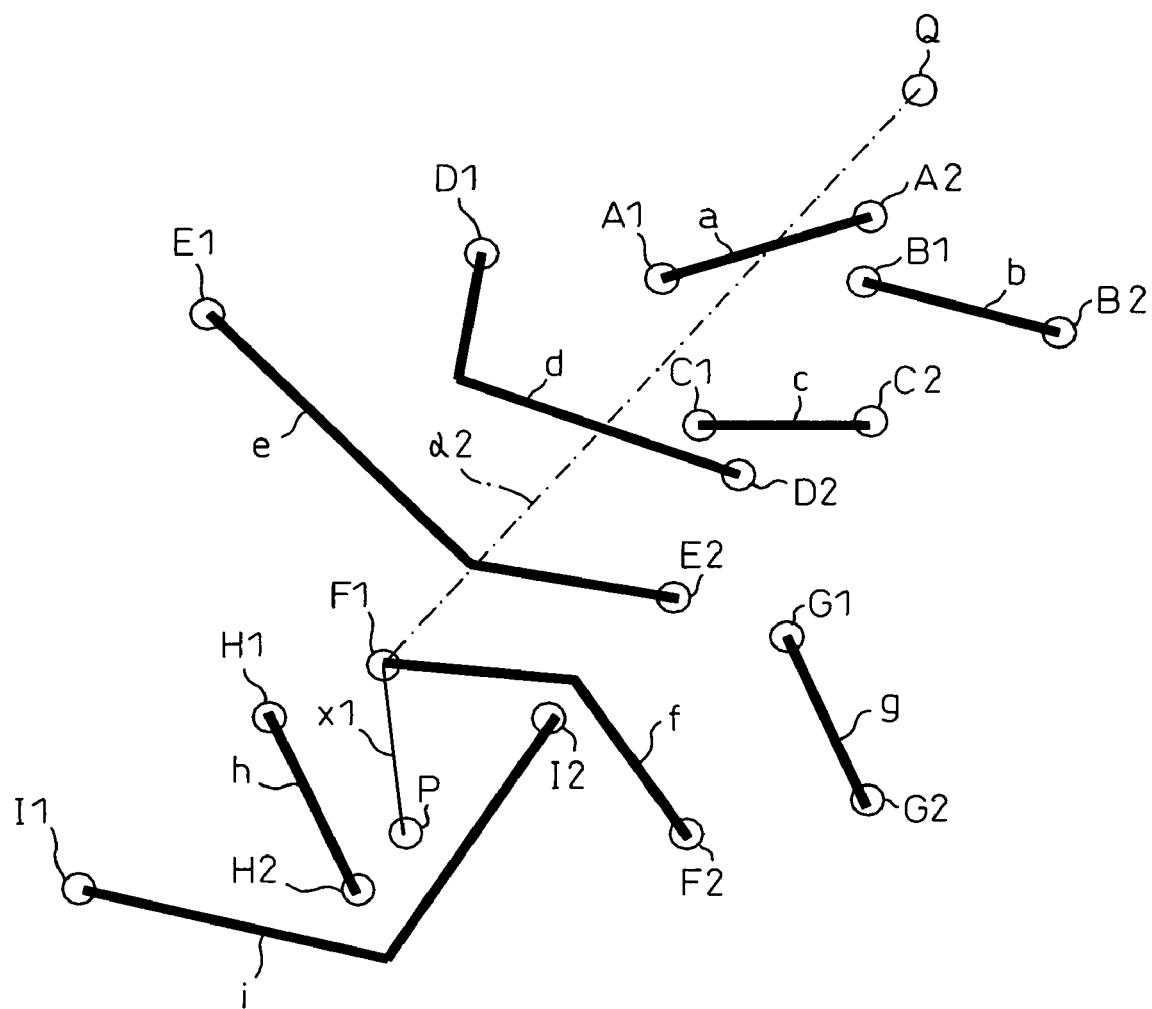

First, as shown in FIG. 3, an inspection line $\alpha 1$ is drawn between the starting point P and the end point Q of the trace, the optimal route of which is to be determined. At this time, the inspection line $\alpha 1$ intersects with the traces a, c, d, e and f. Among these traces a, c, d, e and f intersecting with the inspection line $\alpha 1$, the trace that is nearest to the starting point P is f. Therefore, with respect to the terminal points F1 and F2 of the trace f, clearance between these terminal points and the traces existing around these terminal points is determined. In this case, the terminal point F1 is nearer to the starting point P than the terminal point F2. Further, sufficient clearance cannot be secured between the trace f and the terminal point I2. Therefore, as shown in FIG. 4, a straight line section x1 connecting between the starting point P and the terminal point F1, which is nearer to the starting point P among the terminal points F1 and F2 of the trace f, is determined as a segment. Then, in place of the starting point P, the terminal point F1 is reset as a new starting point.

Figure 5:
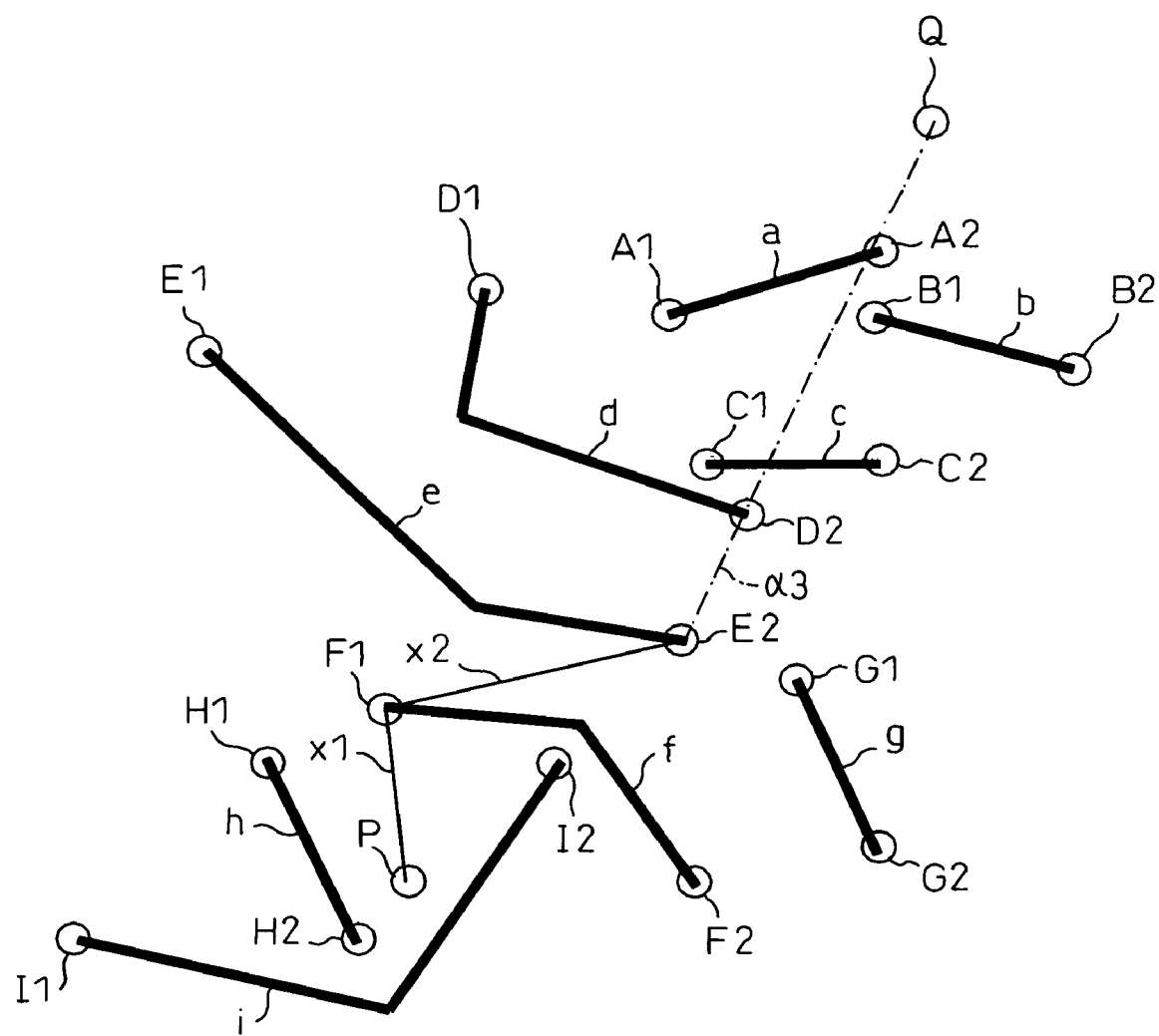

Next, as shown in FIG. 4, an inspection line $\alpha 2$ is drawn between the new starting point F1 and the end point Q. At this time, the inspection line $\alpha 2$ intersects with the traces a, d and e. Among these traces a, d and e intersecting with the inspection line $\alpha 2$, the trace that is nearest to the starting point F1 is e. Therefore, with respect to the terminal points E1 and E2 of the trace e, clearance between these terminal points and the traces existing around these terminal points is determined. In this case, the clearance can be secured from both the terminal points E1 and E2 and the terminal point E2 is nearer to the starting point F1 than the terminal point E1. Therefore, as shown in FIG. 5, a straight line section x2 connecting between the starting point F1 and the terminal point E2, which is nearer to the starting point F1 among the terminal points E1 and E2 of the trace e, is determined as a segment. Then, in place of the starting point F1, the terminal point E2 is reset as a new starting point.

Figure 6:
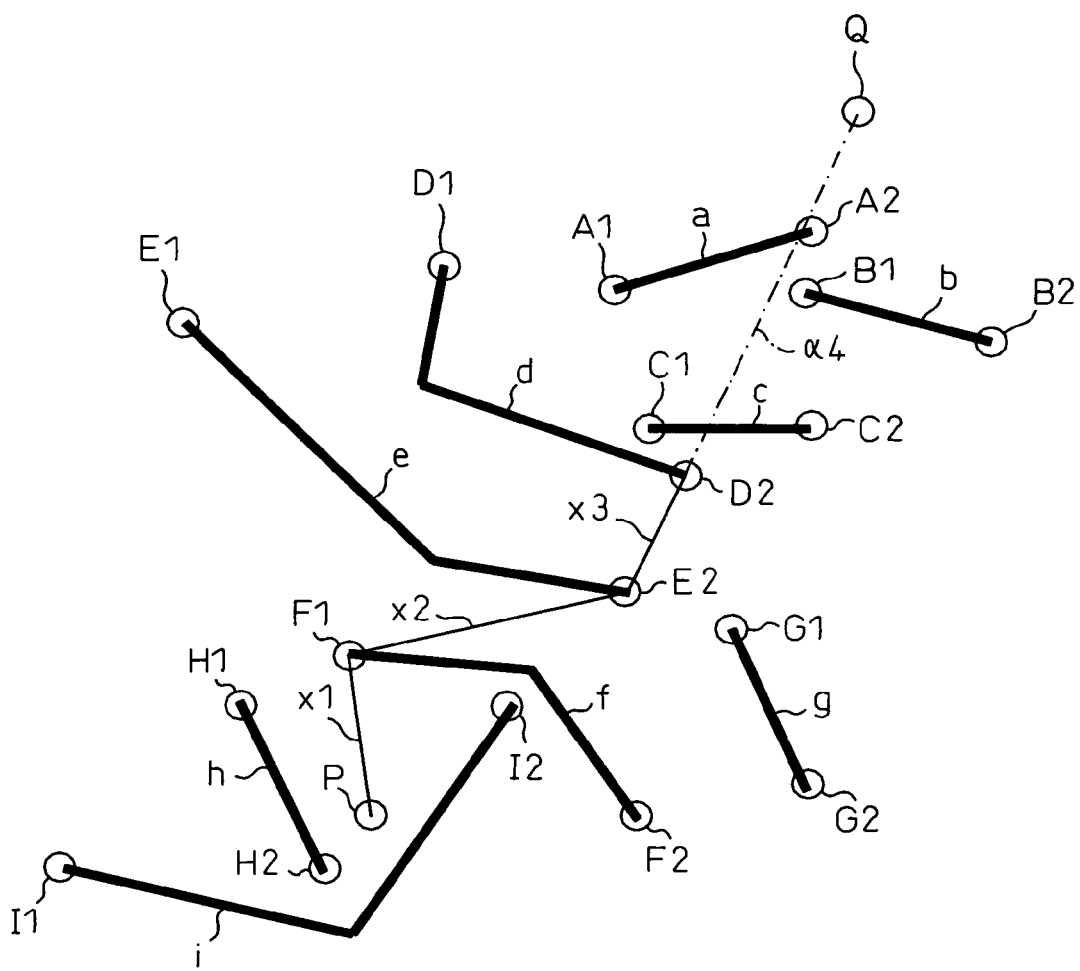

Next, as shown in FIG. 5, an inspection line $\alpha 3$ is drawn between the new starting point E2 and the end point Q. At this time, the inspection line $\alpha 3$ intersects with the traces a, c and d. Among these traces a, c and d, the trace that is nearest to the starting point E2 is d. Therefore, with respect to the terminal points D1 and D2 of the trace d, clearance between these terminal points and the traces existing around these terminal points is determined. In this case, the terminal point D2 is nearer to the starting point E2 than the terminal point D1 and the clearance from the terminal point D2 can be secured. Therefore, as shown in FIG. 6, a straight line section x3 connecting between the starting point E2 and the terminal point D2 is determined as a segment. Then, in place of the starting point E2, the terminal point D2 is reset as a new starting point.

Next, as shown in FIG. 6, an inspection line $\alpha 4$ is drawn between the new starting point D2 and the end point Q. At this time, the inspection line $\alpha 4$ intersects with the traces a and c.

Figure 7:
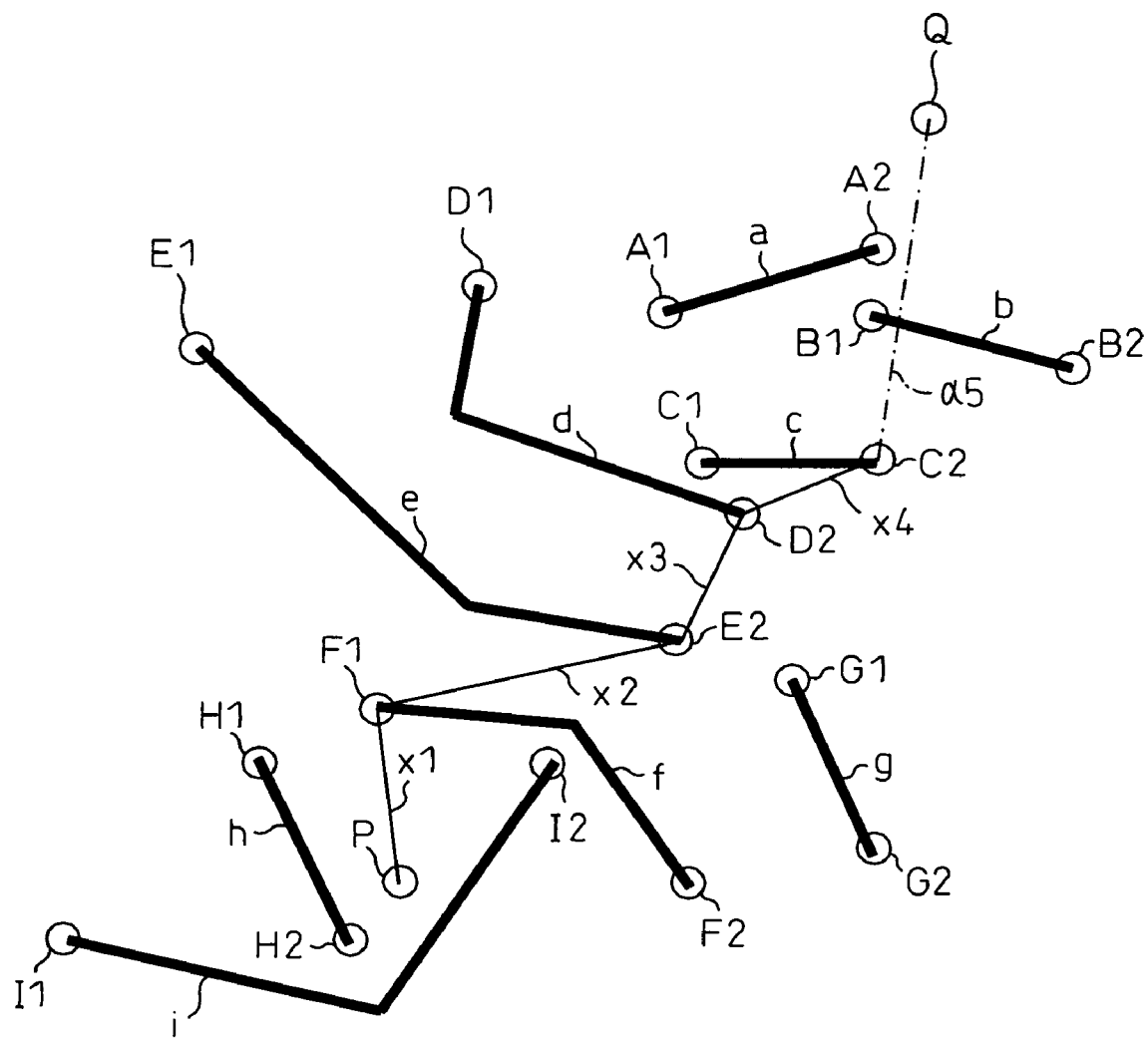

Among these traces a and c intersecting with the inspection line α4, the trace that is nearest to the starting point D2 is c. Therefore, with respect to the terminal points C1 and C2 of the trace c, clearance between these terminal points and the traces existing around these terminal points is determined. In this case, the terminal point C1 is nearer to the starting point D2 than the terminal point C2 but the clearance from the terminal point C1 cannot be secured. Therefore, as shown in FIG. 7, a straight line section x4 connecting between the starting point D2 and the terminal point C2 is determined as a segment. Then, in place of the starting point D2, the terminal point C2 is reset as a new starting point.

Figure 8:
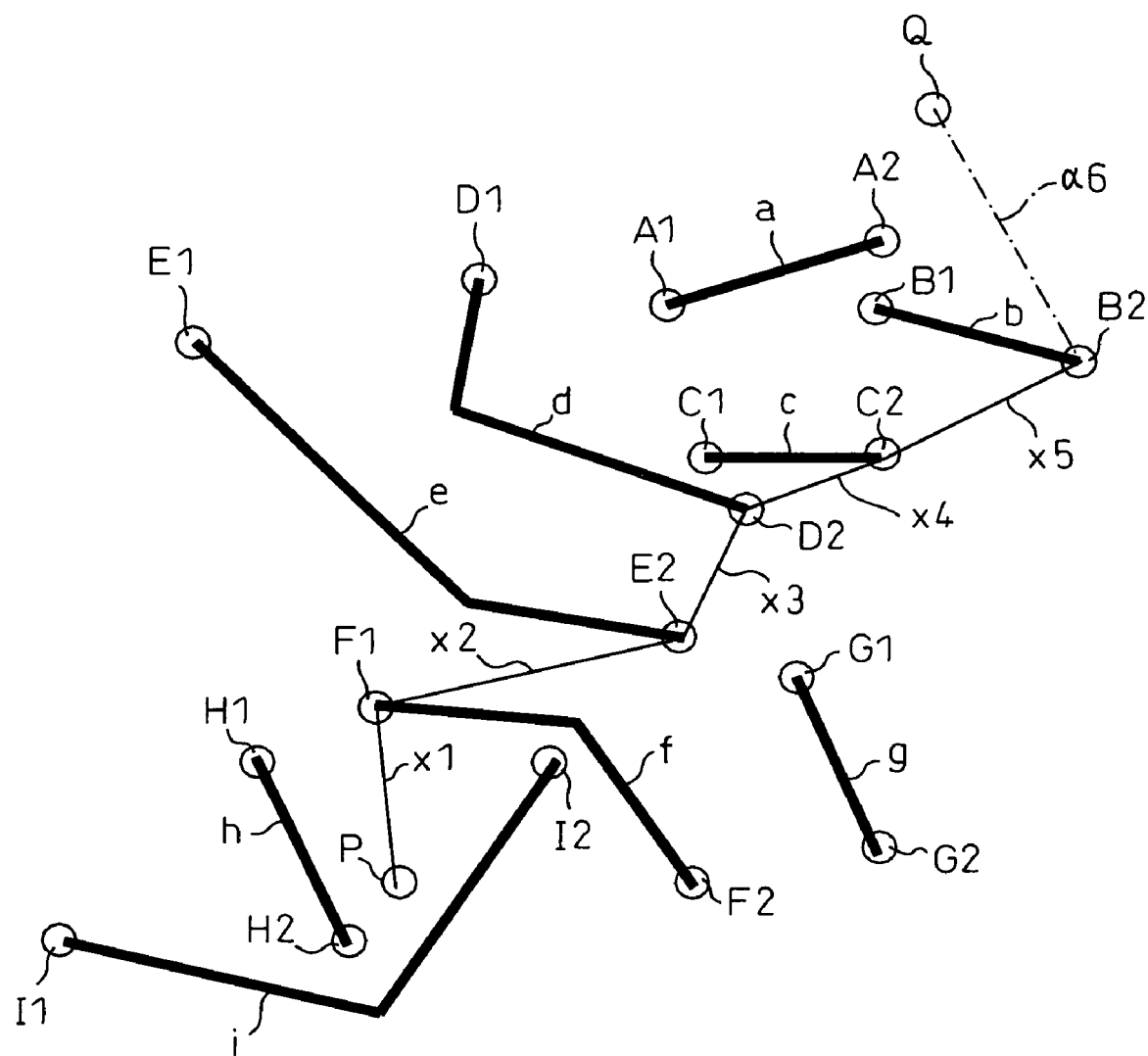

Next, as shown in FIG. 7, an inspection line α5 is drawn between the new starting point C2 and the end point Q. At this time, the inspection line α5 intersects with the trace b. Therefore, with respect to the terminal points B1 and B2 of the trace b, clearance between these terminal points and the traces existing around these terminal points is determined. In this case, the clearance cannot be secured between the terminal point A2 of the trace a and the terminal point B1, which is nearer to the starting point C2. Therefore, with respect to the terminal points other than such terminal point B1 that cannot secure the clearance, clearance from the traces existing around such terminal point is further determined. More specifically, with respect to the terminal point A1 that does not cause the clearance obstruction among the terminal points A1 and A2 of the trace a resulting in such clearance obstruction, and with respect to the terminal point B2 that is farther from the starting point C2 among the terminal points B1 and B2 of the trace b, clearance from the other traces that exist around these terminal points A1 and B2 is further determined. In the shown example, the clearance can be secured from both the terminal points A1 and B2. Therefore, as shown in FIG. 8, a straight line section x5 connecting between the starting point C2 and the terminal point B2, which is nearest to the starting point C2 among these terminal points A1 and B2, is determined as a segment. Then, in place of the starting point C2, the terminal point B2 is reset as a new starting point.

Figure 9:
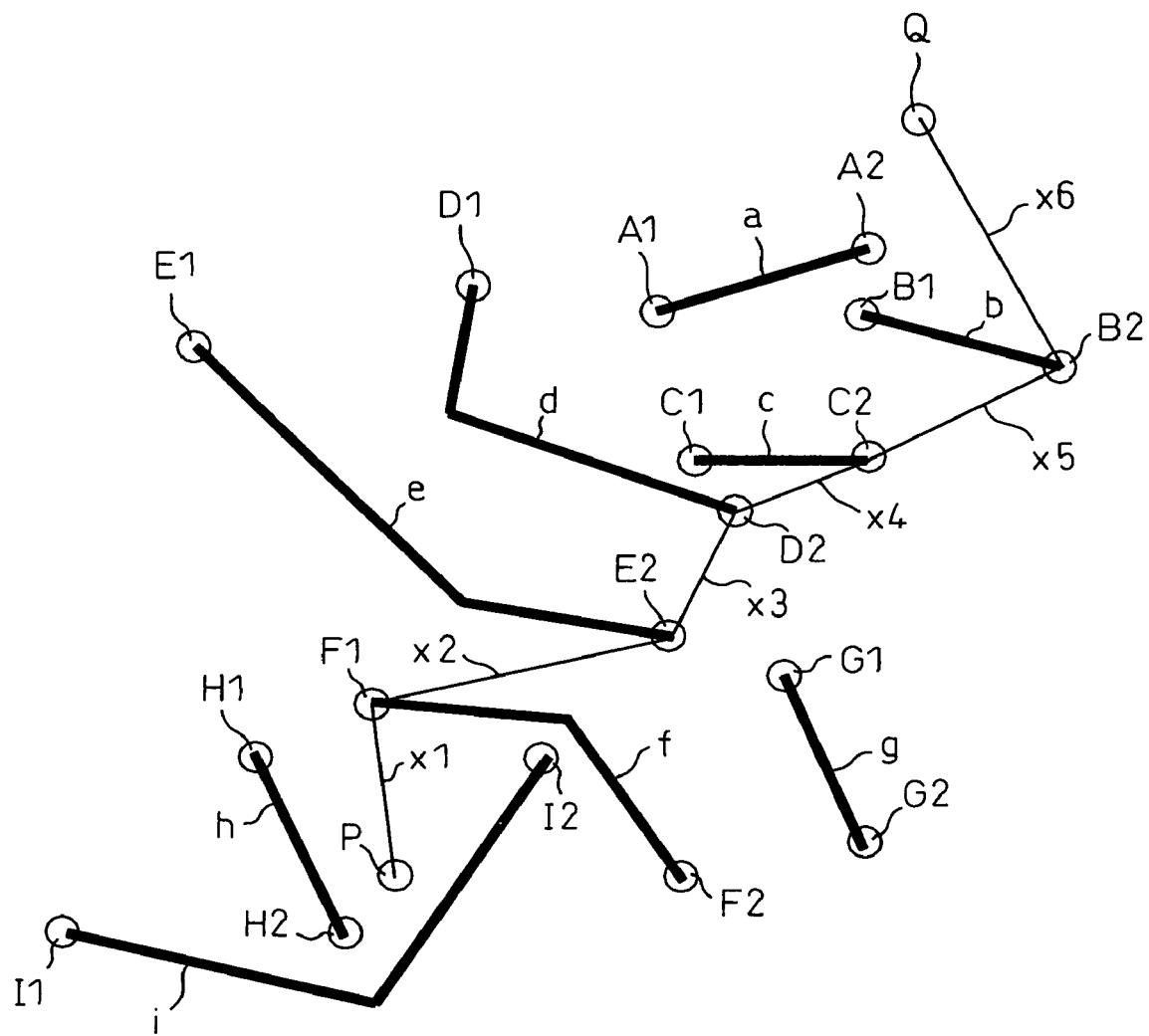

As shown in FIG. 8, an inspection line α6 is drawn between the new starting point B2 and the end point Q. At this time, the inspection line α6 does not intersect with any trace. Therefore, as shown in FIG. 9, the inspection line α6 is determined as a segment α6 as it is.

As described above, when the automatic trace determination process is performed from the computation starting point P, a candidate optimal route comprised of the segments x1, x2, x3, x4, x5 and x6 is generated.

Next, with respect to a case in which the starting point P to start the computation and the end point Q that have been set initially are reversed or, in other words, with respect to a case in which the point Q is set as the computation starting point, the automatic trace determination process is performed. In this case, the process is basically similar to that described above and, therefore, only the result is shown, in FIG. 10, where a candidate optimal route comprised of segments y1, y2, y3, y4 and y5 is generated.

Figure 11:
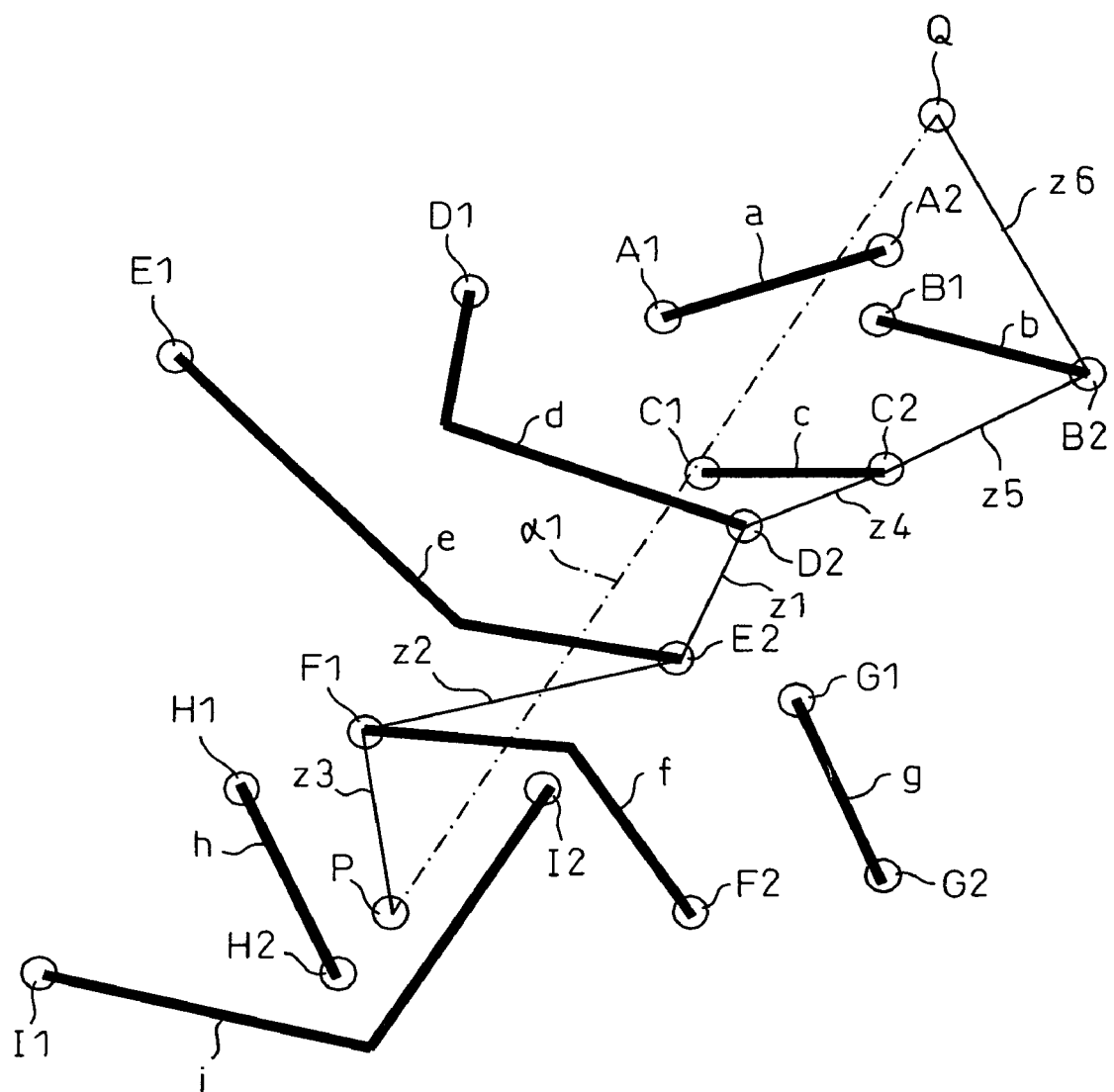

Next, the automatic trace determination process is performed also with respect to a case in which, among the terminal points of the other traces intersecting with the inspection line connecting between the two points that are to be the starting point and the end point of the trace, the optimal route of which is to be determined, the terminal point nearer to the starting point or the end point of the trace is reset as the computation starting point. For example, as shown in FIG. 11, the inspection line α1 connecting between the starting point P and the end point Q of the trace intersects with the five traces a, c, d, e and f. When an inspection line intersects with an odd number of traces, it is preferable to set a trace that is located in the middle of the odd number of traces as the trace having the computation starting point. In an example shown in FIG. 11, the trace d corresponds to such trace and, therefore, the terminal point D2 of this trace d that is nearer to the starting point P or the end point Q is set as the computation starting point. In this connection, when the inspection line intersects with an even number of traces, two traces are located in the middle of the even number of traces and, in this case, any of the two traces may be set as the trace having the computation starting point. As a variation of this, a plurality of computation starting points may further be set.

In the example shown in FIG. 11, the terminal point D2 of the trace d is set as the computation starting point and the automatic trace determination process is performed from this terminal point D2 in both directions toward the starting point P and the end point Q of the trace. The process is basically similar to that described above and, therefore, only the result is shown where the automatic trace determination process from the terminal point D2 in the direction toward the starting point P of the trace determines segments z1, z2 and z3 and the automatic trace determination process from the terminal point D2 in the direction toward the end point Q of the trace determines segments z4, z5 and z6. Therefore, a candidate optimal route comprised of the segments z3, z2, z1, z4, z5 and z6 as shown in FIG. 11 is generated.

Figure 10:
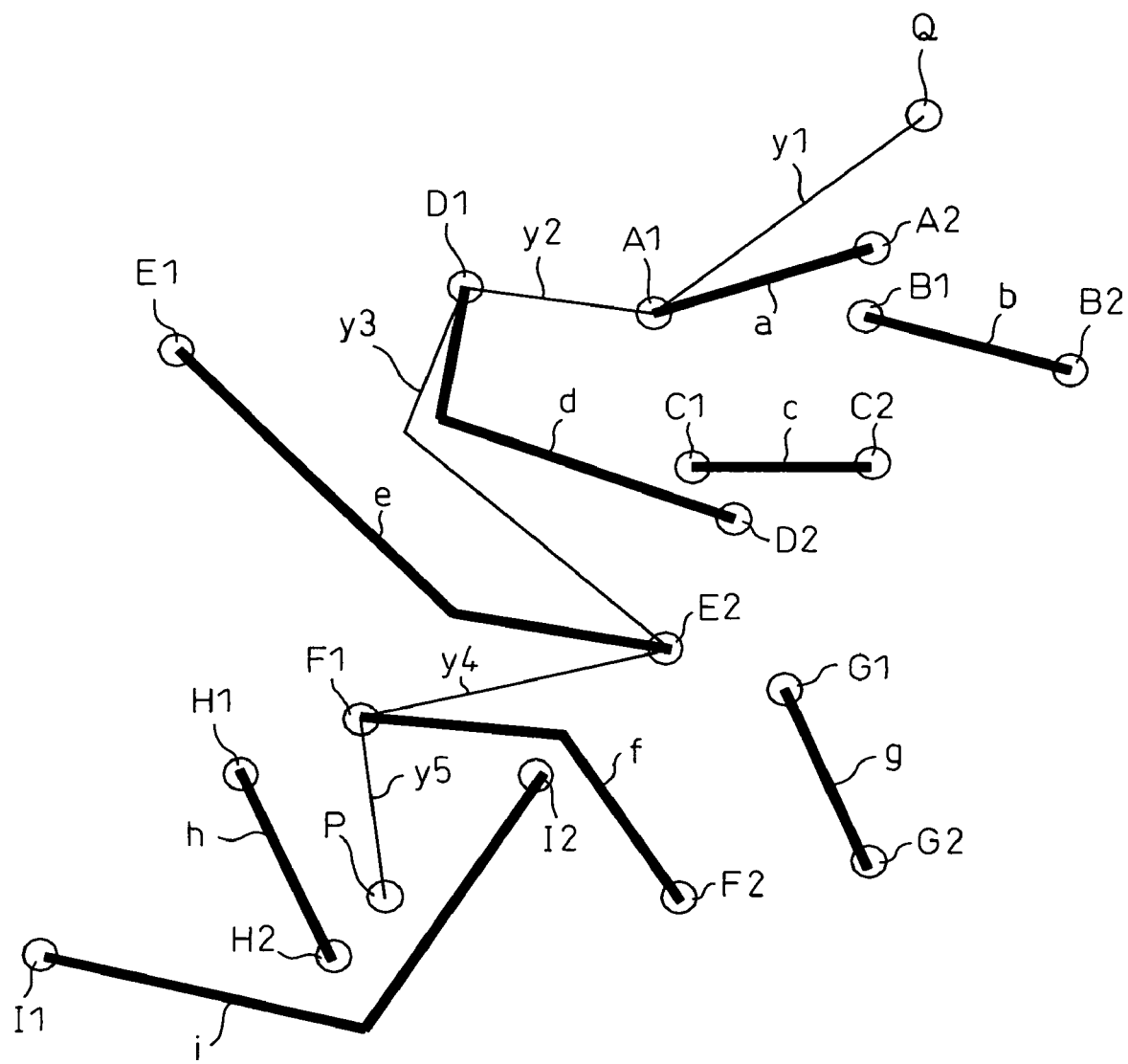

As described above, the three candidate optimal routes as shown in FIGS. 9, 10 and 11 are generated. Finally, distances along the these candidate routes are calculated and a candidate having the shortest distance is eventually determined as an optimal route. In the shown example, the candidate route of FIG. 9 or 11 is the optimal route, which is shown again by thin solid lines β in FIG. 12.

Figure 12:
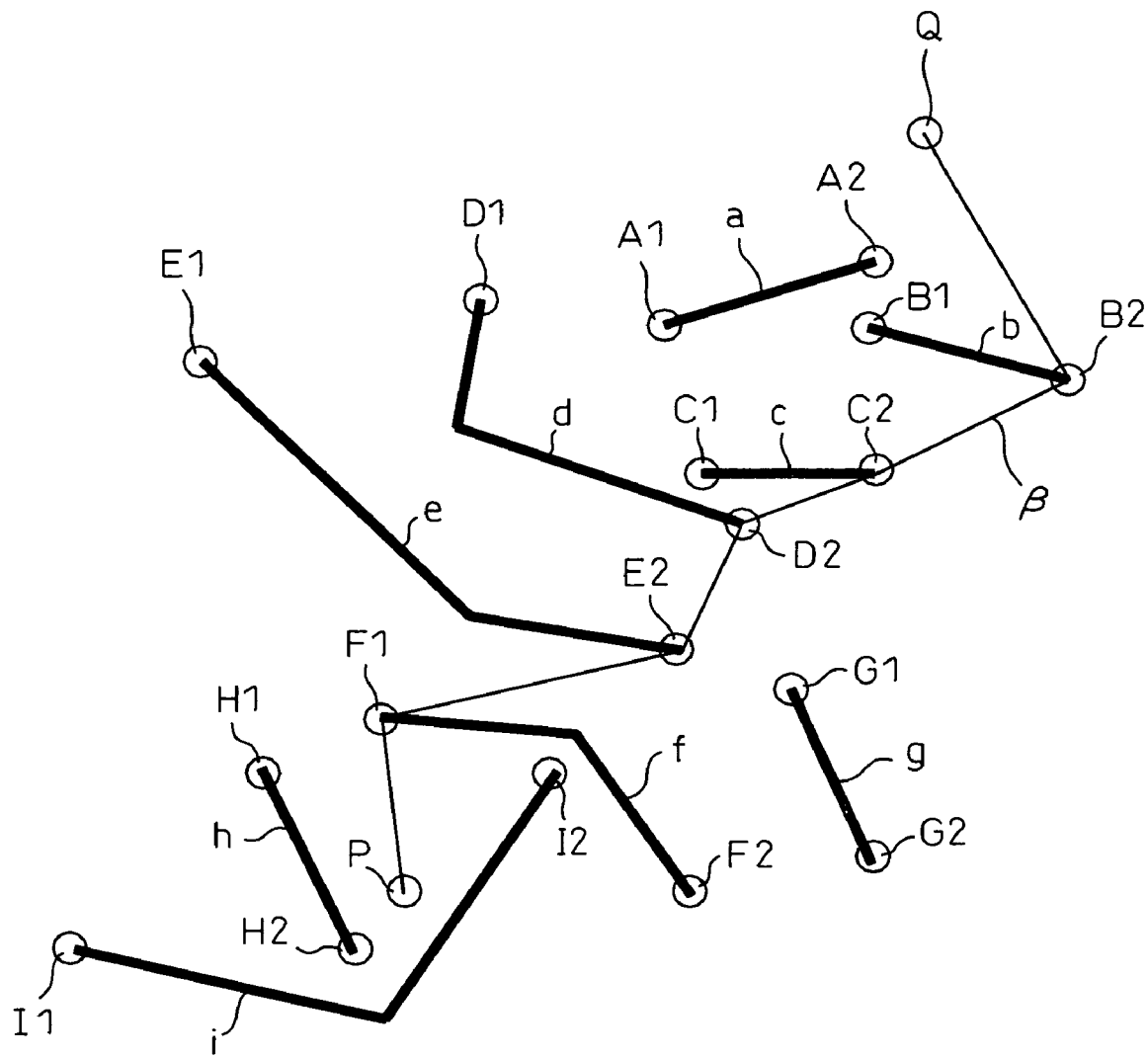
Figure 13:
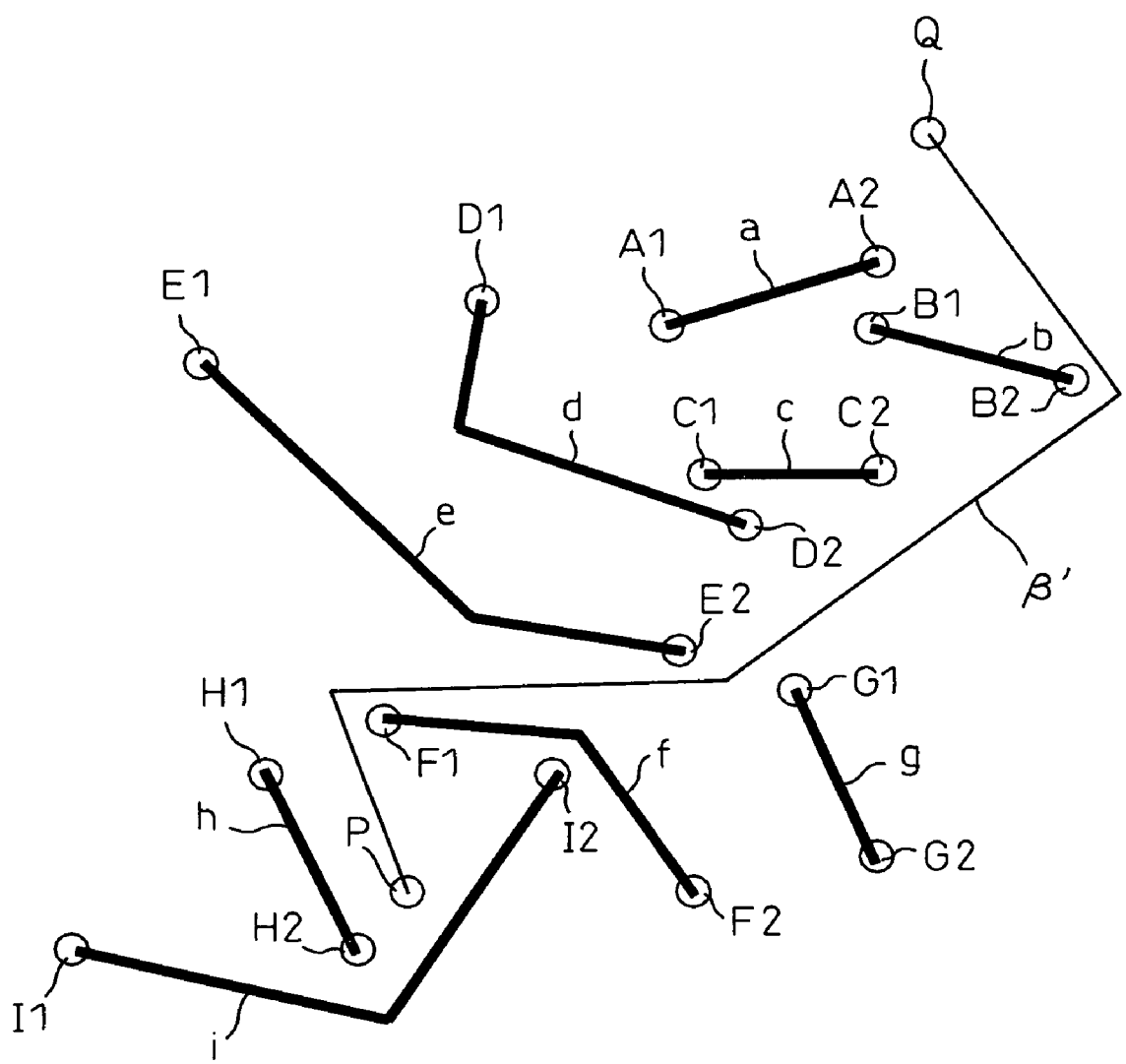

The optimal route that is generated and shown in FIG. 12 is configured to pass through the terminal points of the other trace and, therefore, as shown in FIG. 13, such optimal route is corrected to secure clearance between this optimal route and the other trace and the corrected route is indicated as β' (shown by thin solid lines).

FIGS. 14-19 are diagrams for describing a second specific example of generation of an optimal trace route by an automatic trace determination process in an embodiment of the present invention. In the figures, inspection lines are indicated by alternate long and short dashed lines and determined segments are indicated by thin solid lines.

Figure 14:
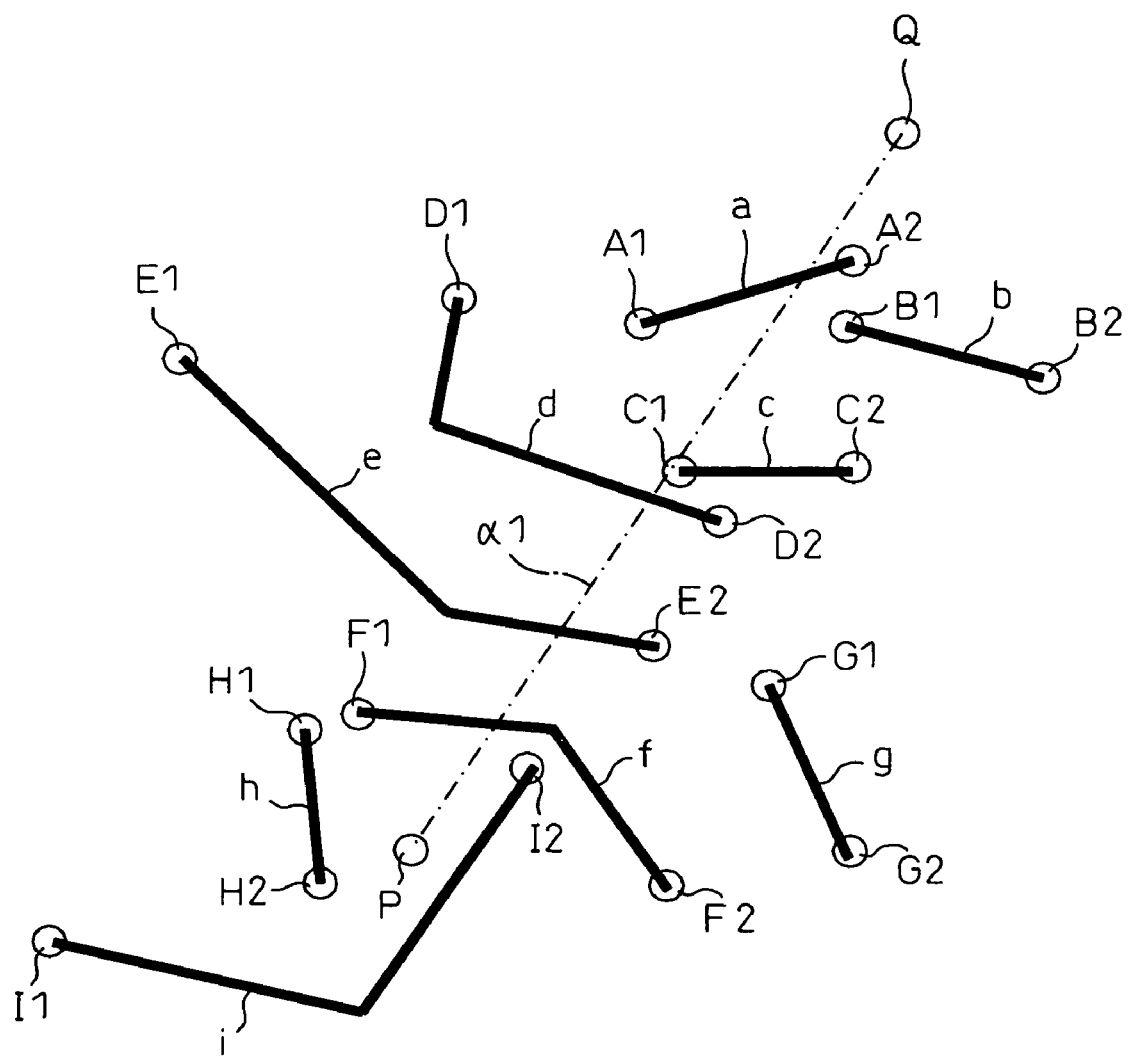
FIGS. 14-19 are diagrams for describing a second specific example of generation of an optimal trace route by an automatic trace determination process in an embodiment of the present invention.

In the second specific example, as shown in FIG. 14, it is assumed that, between a point P, which is to be a starting point of a trace, the optimal route of which is to be determined, and a point Q, which is to be an end point, a plurality of other traces a, b, c, d, e, f, g, h and i (indicated by thick solid lines in the figures) that are different from the above-mentioned trace, exist. Here, terminal points of the traces a, b, c, d, e, f, g, h and i are designated as A1 and A2, B1 and B2, C1 and C2, D1 and D2, E1 and E2, F1 and F2, G1 and G2, H1 and H2, and I1 and I2, respectively (indicated by circles in the figures). In particular, this second specific example assumes that a distance between the terminal point F1 and the terminal point H1 is too small to secure sufficient clearance and to allow the trace to pass between the terminal point F1 and the terminal point H1.

Figure 15:
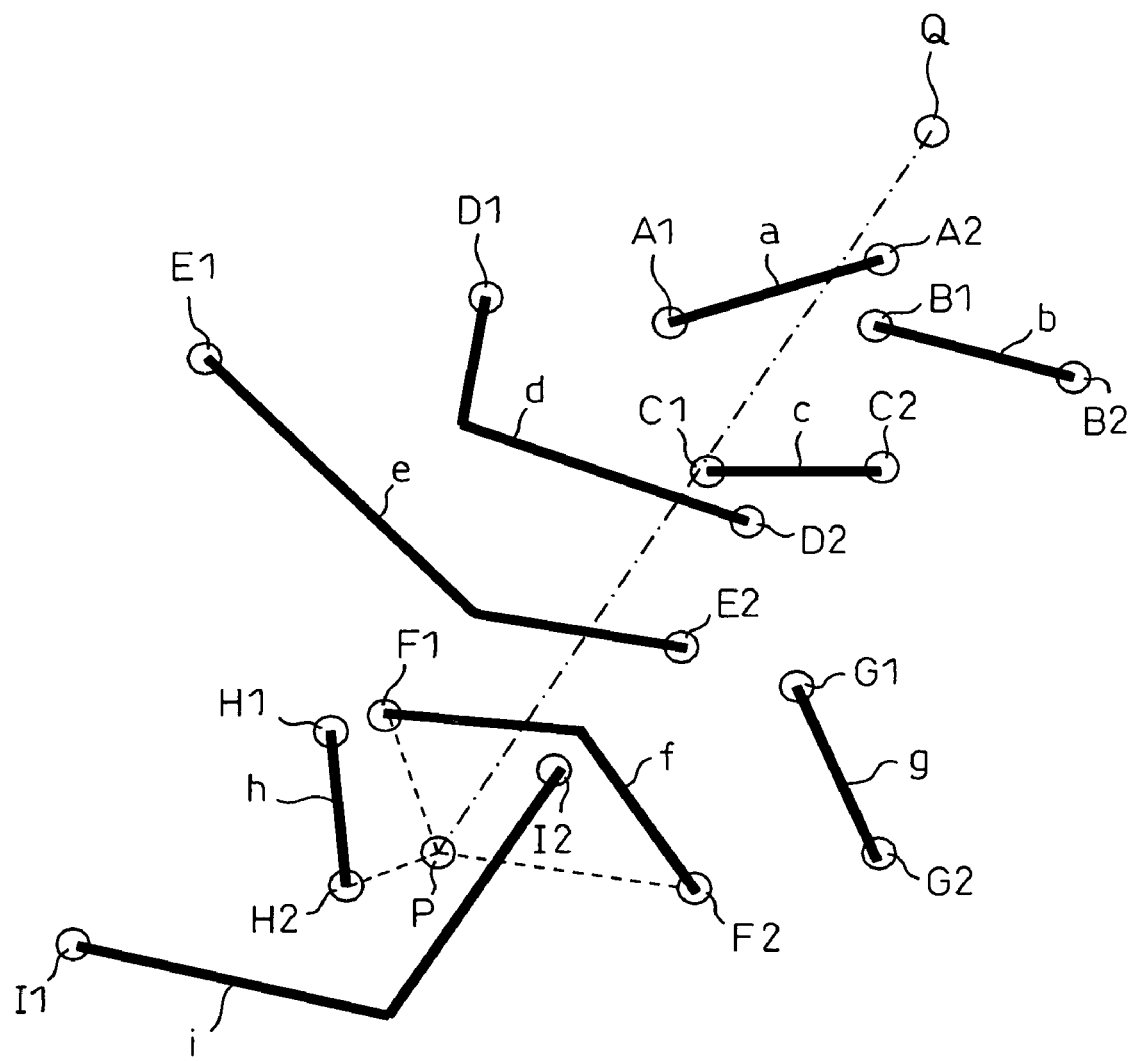
Figure 16:
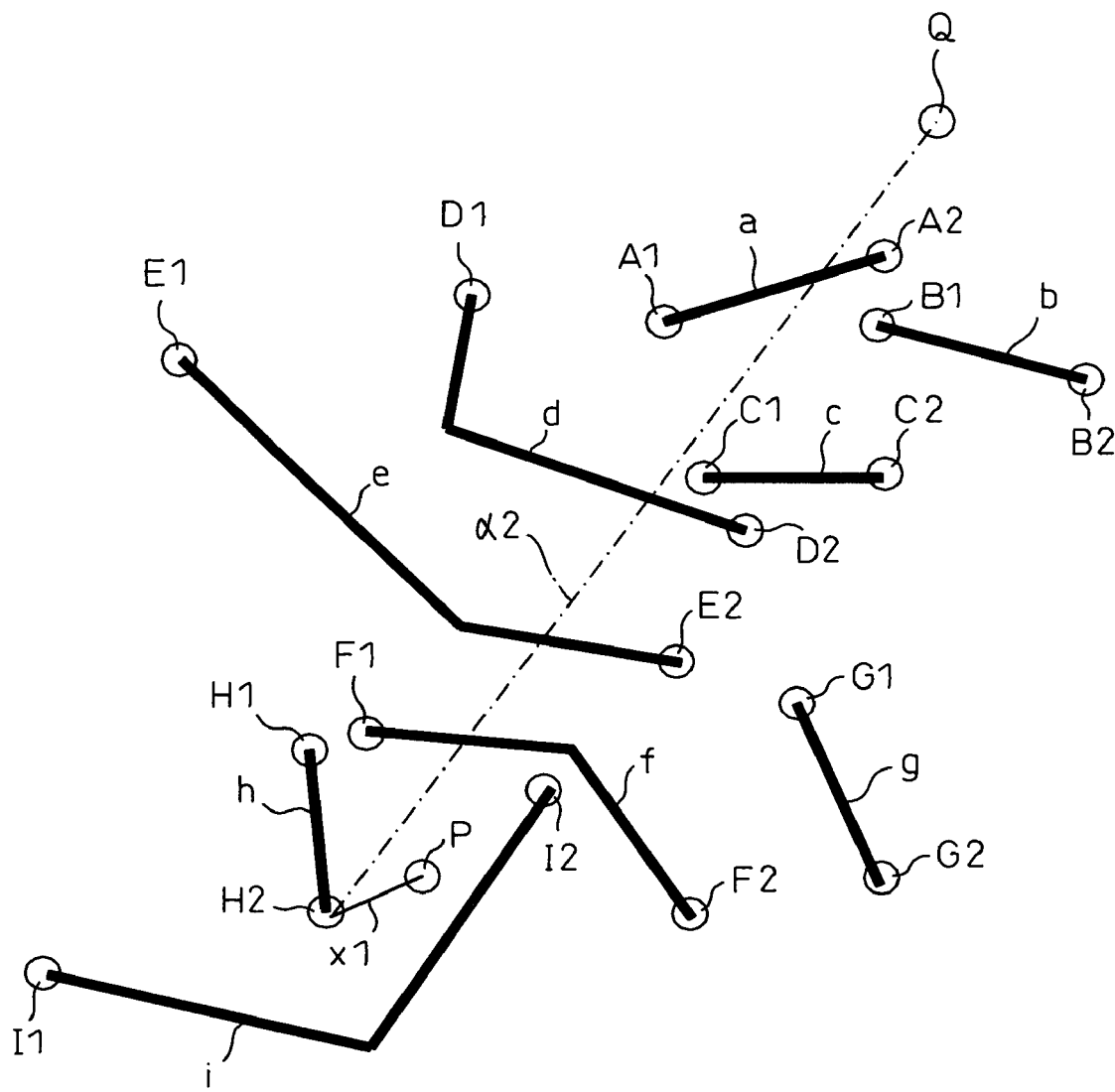

First, as shown in FIG. 14, an inspection line α1 is drawn between the starting point P and the end point Q of the trace, the optimal route of which is to be determined. At this time, the inspection line α1 intersects with the traces a, c, d, e and f. Among these traces a, c, d, e and f intersecting with the inspection line α1, the trace that is nearest to the starting point P is f. Therefore, as shown in FIG. 15, with respect to the terminal point F1 and F2 of the trace f, clearance between these terminal point and the traces existing around these terminal points is determined. In this case, sufficient clearance cannot be secured between the terminal point F1 and the terminal point H1 and between the trace f and the terminal point 12. Therefore, with respect to the terminal points other than such terminal point F1 that cannot secure the clearance, clearance from the traces existing around such terminal points is further determined. More specifically, with respect to the terminal point H2 that does not cause a clearance obstruction at the terminal points H1 and H2 of the trace h resulting in a clearance obstruction, clearance from the other traces that exist around the terminal point H2 is further determined. In the shown example, clearance can be secured from the terminal point H2. Therefore, as shown in FIG. 16, a straight line section x1 connecting between the starting point P and the terminal point H2 is determined as a segment. Then, in place of the starting point P, the terminal point H2 is reset as a new starting point.

Figure 17:
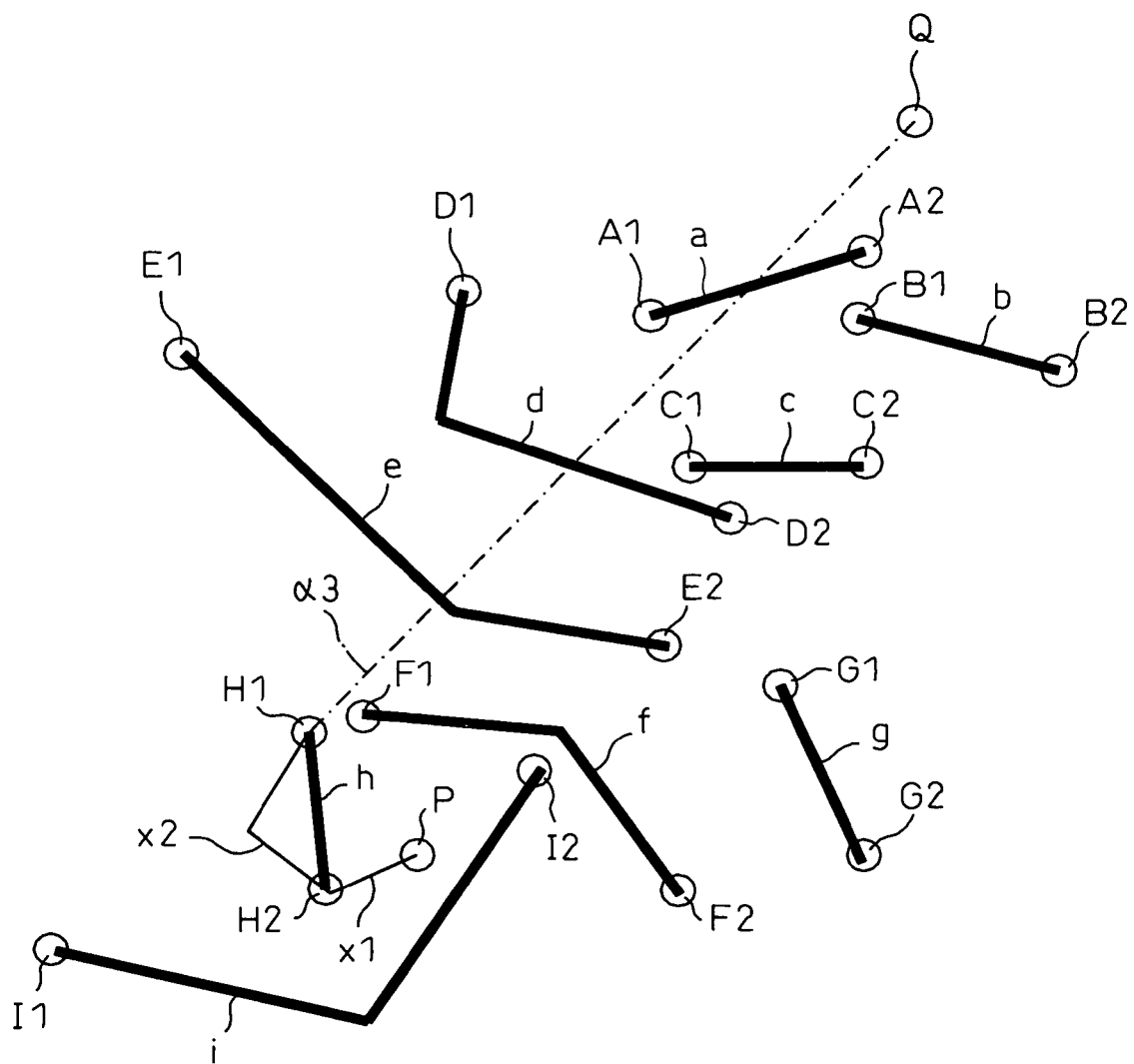

Next, as shown in FIG. 16, an inspection line α2 is drawn between the new starting point H2 and the end point Q. At this time, the inspection line α2 intersects with the traces a, d, e and f. In particular, the inspection line α2 intersects with the trace f that has already been determined (FIG. 15) again. Therefore, as shown in FIG. 17, a straight line section x2 connecting between the starting point H2 and the other end point H1 of the trace h having the starting point H2 that has already been set is determined as a segment. Then, in place of the starting point H2, the terminal point H1 is reset as a new starting point.

Figure 18:
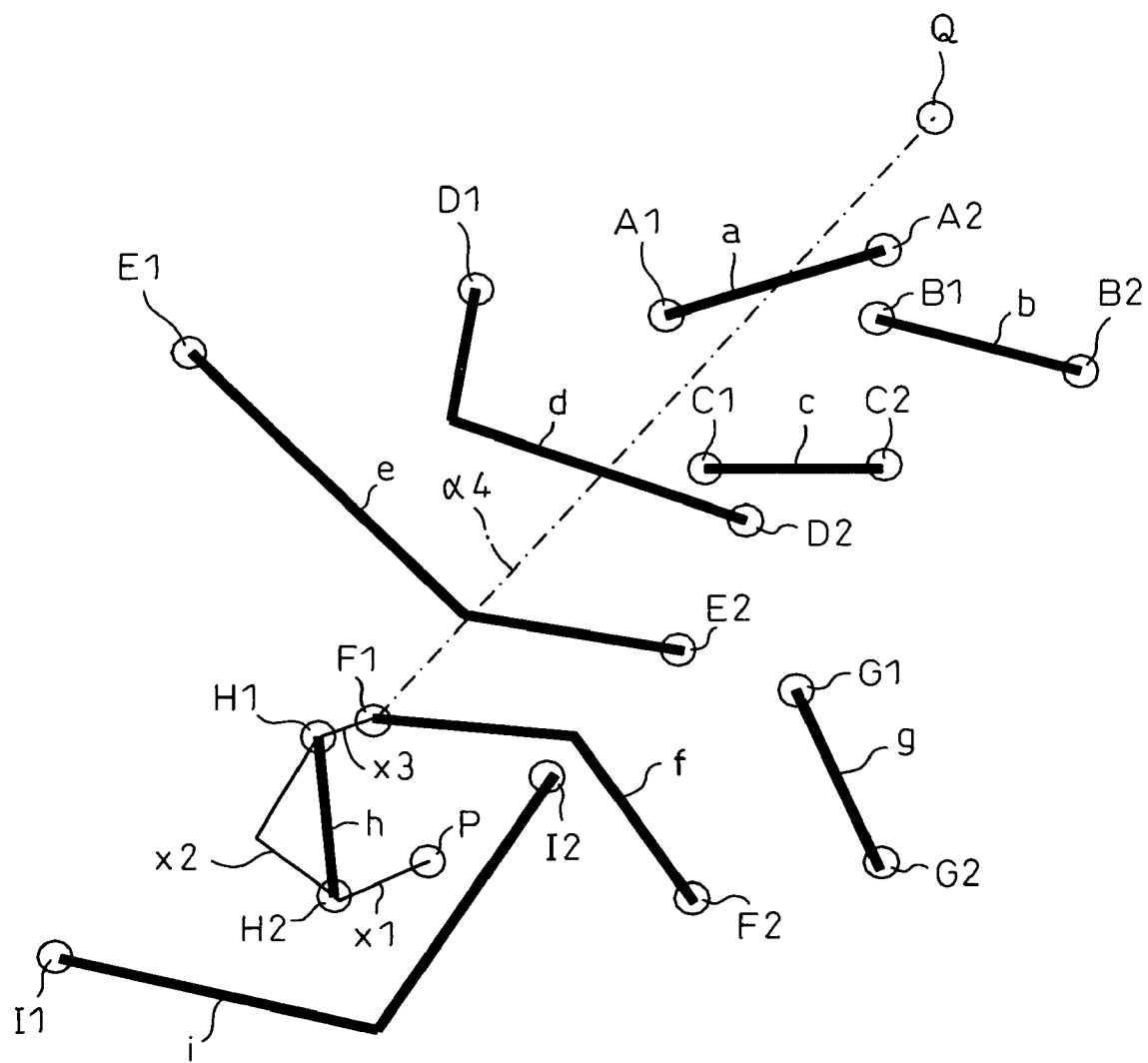
Figure 19:
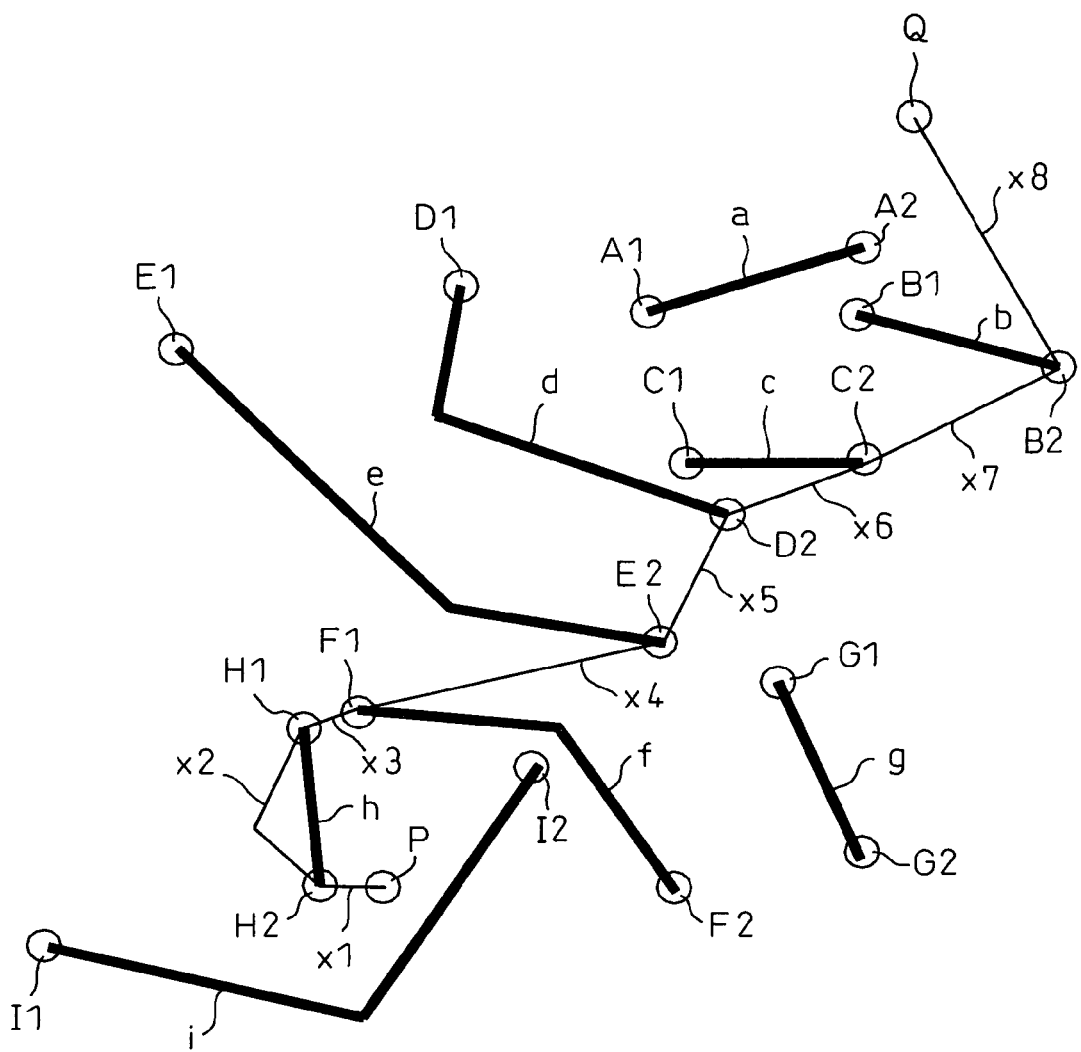

Next, as shown in FIG. 17, an inspection line α3 is drawn between the new starting point H1 and the end point Q. At this time, the inspection line α3 intersects with the traces a, d and e. Among these traces a, d and e intersecting with the inspection line α3, the trace that is nearest to the starting point H1 is e. Therefore, with respect to the terminal points E1 and E2 of the trace e, clearance between these terminal points and the traces existing around these terminal points is determined. In this case, the clearance can be secured from both the terminal points E1 and E2. The terminal point E2 is nearer to the starting point H1 than the terminal point E1 and, therefore, it would be usual to determine a segment connecting between the terminal point E2 and the starting point H1. However, as shown in the figure, a segment connecting the terminal point E2 and the starting point H1 will intersect with the trace f near the terminal point F1. This problem may be avoided by determining a segment connecting between the starting point H1 and the terminal point E1 that can also secure clearance, but it is not so preferable because the distance between the terminal point E1 and the starting point H1 is longer than that between the terminal point E2 and the starting point H1. Therefore, as shown in FIG. 18, a segment x3 connecting between the terminal point F1 and the starting point H1 is determined and, in place of the starting point H1, the terminal point F1 is reset as a new starting point. Thus, in the automatic trace determination process according to the present invention, the segments of the candidate optimal route are sequentially generated one by one and, therefore, it is easy to change wiring conditions such as, for example, trace widths, clearance and the like, of some of the traces, or to change a design of a specific portion manually as desired by a user. Then, as shown in FIG. 18, an inspection line α4 is drawn between the new starting point F1 and the end point Q and, thereafter, the process is performed in the procedure described above, which is basically similar to that described above and, therefore, only the result is shown, in FIG. 19, in which a candidate optimal route comprised of segments x1, x2, x3, x4, x5, x6, x7 and x8 is generated. Here, the optimal route generated as described above is configured to pass through the terminal points of other traces and, therefore, as already described in the first specific example, such optimal route is corrected to secure clearance between the optimal route and the other traces. As a variation of this, before performing the automatic trace determination process, the clearance to be secured may be taken into account in advance and, then, the above-mentioned processes may be performed. In this case, the processes may be performed by enlarging the trace, the optimal route of which is to be determined, and the other traces for the required clearance and, then, replacing the data about the traces for the processes described above with the data taking the clearance into account.

Further, the optimal route generated according to the embodiment of the present invention is comprised of a plurality of segments (straight line sections) combined with each other but, when the wiring is implemented actually using such optimal route, it may be preferable that sharp corners between the segments are rounded smoothly in view of electrical characteristics and the durability of the traces.

The automatic trace determination apparatus according to this embodiment as described above is implemented by using a computer. FIG. 20 is a block diagram showing a configuration of an automatic trace determination apparatus of an embodiment of the present invention that operates according to a program that is stored on a storage medium.

As shown in FIG. 20, a program for allowing a computer to perform automatic trace determination according to the present invention is stored on a storage medium (an external storage medium such as a flexible disk, a CD-ROM and the like) 110 and, for example, it is installed in a computer configured as described below to operate as an automatic trace determination apparatus.

A CPU 111 controls the automatic trace determination apparatus entirely. This CPU 111 is connected to a ROM 113, a RAM 114, a HD (hard disk drive) 115, an input device 116 such as a mouse, a keyboard and the like, an external storage medium drive 117, and a display device 118 such as an LCD, a CRT and the like through a bus 112. A control program for the CPU 111 is stored in the ROM 113.

The program for performing the automatic trace determination process according to the present invention (an automatic trace determination process program) is installed (read) from the storage medium 110 on the HD 115. Further, in the RAM 114, a working area for the CPU 111 to perform the automatic trace determination process and an area for storing a portion of the program for performing the automatic trace determination process are secured. Moreover, in the HD 115, input data, final data and, further, an OS (operating system) and the like are stored in advance.

First, when the computer is turned on, the CPU 111 reads the control program from the ROM 110 and, further, reads the OS from the HD 115 to start the OS. As a result, the computer is ready to install the automatic trace determination process program from the storage medium 110.

Next, the storage medium 110 is mounted on the external storage medium drive 117 and a control command is input from the input device 116 to the CPU 111 to read the automatic trace determination process program stored in the storage medium 110 and store it in the HD 115 and the like. Thus, the automatic trace determination process program is installed on the computer.

After that, once the automatic trace determination process program is activated, the computer operates as the automatic trace determination apparatus. An operator can perform the automatic trace determination process described above by manipulating the input device 116 according to working details and procedures through an interaction indicated on the display device 118. "Data about optimal routes of traces" obtained as a result of the process may be, for example, stored on the HD 115 for utilization in the future, or may be used to indicate the results of the process on the display device 118 visually.

Here, though the program stored in the storage medium 110 is installed on the HD 115 in the computer of FIG. 20, the present invention is not limited to such implementation and the program may be installed on the computer through an information transmission medium such as a LAN and the like or the program may be installed in advance in the HD 115 built in the computer.

According to the present invention, an optimal position of a trace route, that does not intersect with other traces on a substrate, can be determined automatically in a short time by computer computation.

In particular, according to the present invention, a trace that can satisfy requirements for clearance and avoid unnecessary intersection with the other traces can be designed by computation, using a computer, according to design rules without being restricted by shapes, disposed positions and angles and the like of the traces existing on a substrate. More specifically, according to the present invention, on a substrate where a plurality of traces exist, an optimal trace route, that can satisfy requirements for clearance, can be searched for by computer computation automatically in a short time without being restricted by shapes and disposed positions and angles of the traces and regardless of the angles and the starting and ending positions of the traces to be provided. In semiconductor integrated circuits such as an LSI and in a PCB, in semiconductor packages such as PBGA and EBGA or in circuit boards such as MCM/SIP and the like, the present invention can determine trace routes that do not intersect with other traces existing on a substrate.

Further, according to the present invention, in contrast to the related art that determines optimal routes of all traces on a substrate at one time, segments of a candidate optimal route are generated one by one sequentially and, therefore, it is easy to change wiring conditions such as, for example, trace widths, clearance and the like, of some of the traces, or to change a design of a specific portion manually as desired by a user.

In particular, when the present invention is applied to trace design of semiconductor packages, optimal trace routes can be designed in a short time readily without being influenced by the designer's skill, experience, intuition and the like, as required in the related art and, further, without being restricted by shapes, disposed positions and angles of obstacles existing on a substrate. For example, according to the present invention, the optimal trace routes, which were designed by taking some days in the related-art manual trace design by trial and error, can be designed automatically within about a few hours or less. As a result of the reduction of design time and the burden on the designer, the manufacturing costs of products can also be reduced. The optimal trace routes have shorter wiring length and, therefore, they can be more economical and they can be manufactured more easily and they have a lower rate of occurrence of product error in the manufacturing process. Further, the optimal trace routes are also electrically stable.

What is claimed is:

1. An automatic trace determining method for determining an optimal trace route for an intended trace, on a substrate, that does not intersect with one or more other traces on the substrate by computer computation, comprising:

inspecting an inspection line connecting a starting point and an end point of the intended trace to determine whether the inspection line intersects with one or more of the other traces;

when said inspection line intersects with one or more of said other traces, generating candidates by determining a straight line section connecting the starting point and a terminal point of one of such other traces that exists in the nearest position to said starting point as a segment that constitutes a candidate for said optimal route; and resetting the terminal point used for generating candidates when said inspection line intersects with said other traces as a new starting point, wherein, based on inspection lines that are newly drawn between said end point and such new starting points, the acts of inspecting, generating, and resetting are further performed to generate said candidate constituted by said segments;

wherein, with respect to the intended trace, the starting point and the end point are reversed and, then, the acts of inspecting, generating, and resetting are performed to generate another candidate;

determining among a plurality of said generated candidates an optimal route having the shortest distance from said starting point to said end point as said optimal route; and correcting said optimal route to secure clearance between such optimal route and said other traces.

2. An automatic trace determining method according to claim 1, wherein, when the inspection line that is newly drawn between said end point and the terminal point that is reset as said new starting point intersects with other traces, the intersection with which has already been determined when inspecting the inspection line, wherein generating candidates redetermines a straight line section connecting between said starting point and another terminal point of the trace having such new starting point as said segment, and wherein resetting another terminal point of the intended trace having such new starting point as a further new starting point.

3. An automatic trace determining method according to claim 2, further comprising correcting said determined optimal route to secure clearance between such optimal route and said other traces.

4. An automatic trace determining method according to claim 2, wherein, among the terminal points of the other traces intersecting with the inspection line connecting the two points that are to be the starting point and the end point of the trace, the optimal route of which is to be determined, the terminal point nearer to the starting point or the end point of said trace is set as the computation starting point and, then, the acts of inspecting, generating, and resetting are performed from said computation starting point in both directions toward the starting point and the end point of the trace to generate said candidates.

5. An automatic trace determining method according to claim 4, further comprising, among a plurality of said generated candidates, determining a candidate having the shortest distance from said starting point to said end point as said optimal route.

6. An automatic trace determining method according to claim 5, further comprising correcting said determined optimal route to secure clearance between such optimal route and said other traces.

7. An automatic trace determining method according to claim 1, further comprising determining said optimal route from said generated candidates.

8. An automatic trace determining method according to claim 7, further comprising correcting said determined optimal route to secure clearance between such optimal route and said other traces.

9. An automatic trace determining method according to claim 1, wherein, with respect to the trace, the optimal route of which is to be determined, the starting point to start the computation and the end point are reversed to set the computation starting point and, then, the acts of inspecting, generating, and resetting are performed to generate said candidate.

10. An automatic trace determining method according to claim 9, further comprising, among a plurality of said generated candidates, determining a candidate having the shortest distance from said starting point to said end point as said optimal route.

11. An automatic trace determining method according to claim 10, further comprising correcting said determined optimal route to secure clearance between such optimal route and said other traces.

12. An automatic trace determining method according to claim 1, wherein, among the terminal points of the other traces intersecting with the inspection line connecting the two points that are to be the starting point and the end point of the trace, the optimal route of which is to be determined, the terminal point nearer to the starting point or the end point of said trace is set as the computation starting point and, then, the acts of inspecting, generating, and resetting are performed from said computation starting point in both directions toward the starting point and the end point of the trace to generate said candidates.

13. An automatic trace determining method according to claim 12, further comprising, among a plurality of said generated candidates, determining a candidate having the shortest distance from said starting point to said end point as said optimal route.

14. An automatic trace determining method according to claim 13, further comprising correcting said determined optimal route to secure clearance between such optimal route and said other traces.

15. An automatic trace determining method according to claim 1, wherein the trace, the optimal route of which is to be determined, and the other traces are enlarged for a required clearance and, then, the acts of inspecting, generating, and resetting are performed.

16. An automatic trace determining method according to claim 1, wherein, when said inspection line intersects with said other traces, generating candidates further comprises determining a straight line section connecting between said starting point and the terminal point nearer to said starting point among the terminal points of the other trace that exists at the nearest position to said starting point.

17. An automatic trace determining method according to claim 1, wherein generating candidates further comprises:
when said inspection line intersects with said other traces, determining clearance between the terminal point of the trace that exists in the nearest position to said starting point and the traces that exist around such terminal point; and
when said clearance can be secured from the terminal point nearer to said starting point among the terminal points of such other trace, determining a straight line section connecting between such terminal point and said starting point as said segment.

18. An automatic trace determining method according to claim 17, wherein,
when said clearance from the terminal point that is nearer to said starting point among the terminal points of said other trace intersecting with said inspection line cannot be secured, among the terminal points of the trace resulting in such a clearance obstruction, with respect to the terminal point that does not cause such clearance obstruction and with respect to the terminal point farther from said starting point, said clearance inspection step further inspects clearance from the traces that exist around such terminal points, and
when it is decided that said clearance can be secured with respect to any of the terminal points subject to the further clearance inspection in said clearance inspection step, determining a straight line section comprises redetermining a straight line section connecting between said starting point and the terminal point that is nearest to said starting point among the terminal points that can secure said clearance as said segment and said reset step resets such terminal point as a new starting point.

19. An automatic trace determining method according to claim 18, wherein the acts of determining clearance and determining a straight line section are repeated until a terminal point that can secure the clearance is found in said clearance inspection step.

* * * * *